(12) United States Patent
Voldman

(10) Patent No.: US 10,615,260 B1
(45) Date of Patent: Apr. 7, 2020

(54) METHOD FOR FORMING FINFET DEVICE STRUCTURE

(71) Applicant: SILICON SPACE TECHNOLOGY CORPORATION, Austin, TX (US)

(72) Inventor: Steven Howard Voldman, Lake Placid, NY (US)

(73) Assignee: Silicon Space Technology Corporation, Austin, TX (US)

( * ) Notice: Subject to any disclaimer, the term of this patent is extended or adjusted under 35 U.S.C. 154(b) by 0 days.

(21) Appl. No.: 16/048,133

(22) Filed: Jul. 27, 2018

Related U.S. Application Data

(63) Continuation of application No. 15/252,920, filed on Aug. 31, 2016, now Pat. No. 10,038,058.
(Continued)

(51) Int. Cl.
| | |
|---|---|
| *H01L 29/10* | (2006.01) |
| *H01L 27/12* | (2006.01) |
| *H01L 23/556* | (2006.01) |
| *H01L 29/06* | (2006.01) |
| *H01L 29/78* | (2006.01) |
| *H01L 27/092* | (2006.01) |

(52) U.S. Cl.
CPC ........ *H01L 29/1083* (2013.01); *H01L 23/556* (2013.01); *H01L 27/0924* (2013.01); *H01L 27/1211* (2013.01); *H01L 29/0646* (2013.01); *H01L 29/1087* (2013.01); *H01L 29/785* (2013.01); *H01L 29/7851* (2013.01)

(58) Field of Classification Search
None
See application file for complete search history.

(56) References Cited

U.S. PATENT DOCUMENTS

| 4,054,894 A | 10/1977 | Heagerty et al. |
|---|---|---|
| 4,161,417 A | 7/1979 | Yim et al. |
(Continued)

FOREIGN PATENT DOCUMENTS

| EP | 0057126 A2 | 8/1982 |
|---|---|---|
| GB | 2314973 A | 1/1998 |
(Continued)

OTHER PUBLICATIONS

Puchner, H. et al., "N-Well Engineering to Improve Soft-Error-Rate Immunity for P-Type Substrate SRAM Technologies," 2001 ESDERC Conference, Dresden, Germany, Sep. 10-14, 2009, 4 pages.
(Continued)

*Primary Examiner* — Anthony Ho
*Assistant Examiner* — Kevin Quinto

(57) ABSTRACT

A low electrical and thermal resistance FinFET device includes a semiconductor body, a fin body on the substrate wafer, an isolation structure forming a fin connecting region, a gate dielectric on the fin body extending above the isolation structure, a FinFET gate electrode on the gate dielectric, a heavily-doped buried layer in the semiconductor body extending under said fin, and a vertical conductive region extending from the semiconductor body surface to the heavily-doped buried layer. Additionally, a fin body-to-buried layer implanted region disposed in the fin connecting region provides a low electrical and thermal resistance shunt from the fin body to the heavily-doped buried layer.

37 Claims, 18 Drawing Sheets

Related U.S. Application Data

(60) Provisional application No. 62/333,176, filed on May 7, 2016.

(56) References Cited

U.S. PATENT DOCUMENTS

| | | |
|---|---|---|
| 4,639,761 A | 1/1987 | Singer et al. |
| 4,746,963 A | 5/1988 | Uchida et al. |
| 4,825,274 A | 4/1989 | Higuchi et al. |
| 4,887,142 A | 12/1989 | Bertotti et al. |
| 4,936,928 A | 6/1990 | Shaw et al. |
| 4,980,747 A | 12/1990 | Hutter et al. |
| 5,138,420 A | 8/1992 | Komori et al. |
| 5,192,993 A | 3/1993 | Arai et al. |
| 5,220,192 A | 6/1993 | Owens et al. |
| 5,304,833 A | 4/1994 | Shigeki et al. |
| 5,376,816 A | 12/1994 | Nishigori et al. |
| 5,386,136 A | 1/1995 | Williams et al. |
| H1435 H | 5/1995 | Cherne et al. |
| 5,446,305 A | 8/1995 | Komori et al. |
| 5,495,124 A | 2/1996 | Terashima |
| 5,501,993 A | 3/1996 | Borland |
| 5,641,982 A | 6/1997 | Takahashi |
| 5,719,733 A | 2/1998 | Wei et al. |
| 5,728,612 A | 3/1998 | Wei et al. |
| 5,821,572 A | 10/1998 | Walker et al. |
| 5,835,986 A | 11/1998 | Wei et al. |
| 5,843,813 A | 12/1998 | Wei et al. |
| 5,858,828 A | 1/1999 | Seliskar et al. |
| 5,880,515 A | 3/1999 | Bartlett |
| 5,894,153 A | 4/1999 | Walker et al. |
| 5,904,551 A | 5/1999 | Aronowitz et al. |
| 5,962,902 A | 10/1999 | Kato et al. |
| 5,963,801 A | 10/1999 | Aronowitz et al. |
| 5,966,599 A | 10/1999 | Walker et al. |
| 5,985,705 A | 11/1999 | Seliskar |
| 6,054,741 A | 4/2000 | Tokunaga |
| 6,057,588 A | 5/2000 | Yamazaki |
| 6,063,672 A | 5/2000 | Miller et al. |
| 6,069,048 A | 5/2000 | Daniel |
| 6,136,672 A | 10/2000 | Bourdelle et al. |
| 6,137,142 A | 10/2000 | Burr |
| 6,144,076 A | 11/2000 | Puchner et al. |
| 6,165,821 A | 12/2000 | Boden, Jr. et al. |
| 6,171,967 B1 | 1/2001 | Jun |
| 6,288,424 B1 | 9/2001 | Ludikhuize |
| 6,309,940 B1 | 10/2001 | Lee |
| 6,316,817 B1 | 11/2001 | Seliskar et al. |
| 6,319,793 B1 | 11/2001 | Bartlett et al. |
| 6,333,520 B1 | 12/2001 | Inoue |
| 6,348,718 B1 | 2/2002 | Leipold et al. |
| 6,355,960 B1 | 3/2002 | Lin et al. |
| 6,365,932 B1 | 4/2002 | Kouno et al. |
| 6,395,611 B1 | 5/2002 | Belk et al. |
| 6,455,893 B1 | 9/2002 | Gehrmann et al. |
| 6,462,378 B1 | 10/2002 | Kim |
| 6,469,355 B1 | 10/2002 | Schneider et al. |
| 6,472,715 B1 | 10/2002 | Liu et al. |
| 6,476,451 B2 | 11/2002 | Wong |
| 6,492,270 B1 | 12/2002 | Lou |
| 6,501,155 B2 | 12/2002 | Okawa |
| 6,514,824 B1 | 2/2003 | Ranazzo et al. |
| 6,521,952 B1 | 2/2003 | Ker et al. |
| 6,525,377 B1 | 2/2003 | Seliskar |
| 6,593,621 B2 | 7/2003 | Tsuchiko et al. |
| 6,664,608 B1 | 12/2003 | Burr |
| 6,667,202 B2 | 12/2003 | Suzuki |
| 6,673,635 B1 | 1/2004 | Hellig et al. |
| 6,677,657 B2 | 1/2004 | Gardes |
| 6,706,583 B1 | 3/2004 | Comard |
| 6,710,416 B1 | 3/2004 | Xu |
| 6,787,858 B2 | 9/2004 | Zitouni et al. |
| 6,822,298 B2 | 11/2004 | Kaneko et al. |
| 6,838,348 B2 | 1/2005 | Babcock et al. |
| 6,847,065 B1 | 1/2005 | Lum |
| 6,864,152 B1 | 3/2005 | Mirbedini et al. |
| 6,864,543 B2 | 3/2005 | Kaneko et al. |
| 6,864,559 B2 | 3/2005 | Nakazato et al. |
| 6,885,078 B2 | 4/2005 | Bartlett et al. |
| 6,909,143 B2 | 6/2005 | Jeon et al. |
| 6,909,150 B2 | 6/2005 | Davis |
| 6,919,598 B2 | 7/2005 | Hossain et al. |
| 6,924,531 B2 | 8/2005 | Chen et al. |
| 6,927,453 B2 | 8/2005 | Shibib et al. |
| 6,940,131 B2 | 9/2005 | Baldwin et al. |
| 6,940,170 B2 | 9/2005 | Parikh |
| 7,304,354 B2 | 12/2007 | Morris |
| 7,456,071 B2 | 11/2008 | Marty et al. |
| 7,629,654 B2 | 12/2009 | Morris |
| 7,804,138 B2 | 9/2010 | Morris |
| 8,093,145 B2 | 1/2012 | Morris |
| 8,252,642 B2 | 8/2012 | Morris |
| 8,278,719 B2 | 10/2012 | Morris |
| 8,497,195 B2 | 7/2013 | Morris |
| 8,729,640 B2 | 5/2014 | Morris |
| 8,972,819 B2 | 3/2015 | Morris et al. |
| 9,201,726 B2 | 12/2015 | Morris et al. |
| 9,268,637 B2 | 2/2016 | Gifford et al. |
| 2001/0008294 A1 | 7/2001 | Jang et al. |
| 2001/0010382 A1 | 8/2001 | Gregory |
| 2001/0021559 A1 | 9/2001 | Norstrom et al. |
| 2001/0048135 A1 | 12/2001 | Leipold |
| 2002/0149067 A1 | 10/2002 | Mitros et al. |
| 2002/0158277 A1 | 10/2002 | Harada et al. |
| 2002/0182884 A1 | 12/2002 | Bernkopf et al. |
| 2003/0077875 A1 | 4/2003 | Mandelman et al. |
| 2004/0075144 A1 | 4/2004 | Zitouni et al. |
| 2004/0106291 A1 | 6/2004 | Ho et al. |
| 2004/0108554 A1 | 6/2004 | Hshieh et al. |
| 2004/0124444 A1 | 7/2004 | Kalburge et al. |
| 2004/0126940 A1 | 7/2004 | Inoue |
| 2005/0098846 A1 | 5/2005 | Nagaoka |
| 2005/0269601 A1 | 12/2005 | Tsubaki |
| 2008/0142899 A1 | 6/2008 | Morris |
| 2014/0281810 A1 | 9/2014 | Gifford et al. |
| 2015/0169400 A1 | 6/2015 | Morris et al. |
| 2015/0364498 A1* | 12/2015 | Lukes .............. H01L 29/66795 257/348 |

FOREIGN PATENT DOCUMENTS

| | | |
|---|---|---|
| JP | 57-143843 A | 9/1982 |
| JP | 61240671 | 10/1986 |
| JP | 62-250671 A | 10/1987 |
| JP | 01-265555 A | 10/1989 |
| JP | 01273346 | 11/1989 |
| JP | 04-003920 A | 1/1991 |
| JP | 04-139758 A | 5/1992 |
| JP | 2000-049237 A | 2/2000 |
| JP | 2002-158293 A | 5/2002 |
| WO | 9425988 | 11/1994 |

OTHER PUBLICATIONS

Ziegler, James F., and Puchner, Helmut, SER—History, Trends and Challenges, Cypress Semiconductor Corporation, 2004, Ch. 6, "Process Techniques to Improve SER Immunity," pp. 6-3 to 6-16 and Ch. 8, "Modeling SER from Alpha Particles," pp. 8-3 to 8-13.

Leonard Rockett, Radiation Hardened CMOS Technologies using Buried Power Grids, TechOnline (http://www.techonline.com), Mar. 20, 2012, 26 pgs.

Silicon Space Technology, HardSIL™, HardSIL SRAMS, presented at HiTEC, Albuquerque, New Mexico, May 2012, 35 pgs.

R. Lowther, et al., Latchup Immunity in High Temperature Bulk CMOS Devices, presented at HiTEN, Jul. 2011, Paper (6 pgs.) and accompanying slide presentation (28 pgs.).

Van Zant, Peter, Microchip Fabrication: A Practical Guide to Semiconductor Processing, McGraw-Hill, 2000, Ch. 3: pp. 62-63; Ch. 13: pp. 396-397, 402-403, and 406-407 (best available copy).

Bashir, Rashid et al., "A Complementary Bipolar Technology Family With a Vertically Integrated PNP for High-Frequency Analog Application," IEEE Transactions of Electron Devices, vol. 48, No. 11, Nov. 2001, © 2001 by IEEE, pp. 2525-2534.

(56) References Cited

OTHER PUBLICATIONS

Benedetto, Joseph M., "Economy-Class Ion-Defying ICs in Orbit," reprinted from IEEE Spectrum, vol. 35, No. 3, Mar. 1998, 6 pages.
Bourdelle et al., "Evaluation of High Dose, High Energy Boron Implantation into Cz Substrates for Epi-Replacement in CMOS Technology," IEEE Transactions on Electron Devices, vol. 48, No. 9, Sep. 2001, © 2001 IEEE pp. 2043-2049.
Bourdelle, et al., "Epi-Replacement in CMOS Technology by High Dose, High Energy Boron Implantation into Cz Substrates," Conference on Ion Implantation Technology; Alpbach, Austria; Sep. 2000, © 2000 IEEE; pp. 312-315.
Frei, M.R., et al., "Integration of High-Q Inductors in a Latch-Up Resistant CMOS Technology," Proceedings of the International Electron Devices Meeting, Dec. 1999, pp. 757-760.
Harame, D.L., et al., Design Automation Methodology and rf/analog Modeling for rf CMOS and SiGe BiCMOS Technologies, IBM J. Res. & Dev., vol. 47, No. 213, Mar./May 2003, © 2003 by IBM, pp. 139-175.
Jordan, Anthony, "Rad Hard, Space Ready, Case Study: Evolution of a Fab-Independent Radiation-Hardened COTS IC Supplier," Reprinted from COTS Journal, Nov. 2001, 5 pages.
Leong, K.C., et al., "Superior Latch-up Resistance of High Dose, High Energy Implanted p+ Buried Layers," 1998 International Conference on Ion Implantation Technology Proceedings; vol. 1; Kyoto, Japan; © 1999 IEEE; pp. 99-101.
Morris, et al., "Buried Layer/Connecting Layer High Energy Implantation for Improved CMOS Latch-up," 1996 Proceedings of the 11th International Conference on Ion Implantation Technology; Austin, Texas; © 1997 IEEE; pp. 796-799.
Morris, Wesley, "Latchup in CMOS," IEEE 03CH37400, 41st Annual International Reliability Physics Symposium, Dallas, Texas, 2003, © 2003 by IEEE, pp. 76-84.
Morris. W., et al., "Technical and Economic Considerations for Retrograde Well and Channel Implants," Proceedings of IEEE Conference on Ion Implantation Technology, Sep. 17-22, 2000, pp. 73-76.
Pech et al., "Extended Defects in Silicon by MeV B++ Implantation in Different 8" Cz-Si Wafers, 1998 International Conference on Ion Implantation Technology Proceedings; vol. 2; Kyoto, Japan; © 1999 IEEE; pp. 756-759.
Rubin et al., "Effective Gettering of Oxygen by High Dose, High Energy Boron Buried Layers," 1998 International Conference on Ion Implantation Technology Proceedings; vol. 2; Kyoto, Japan; © 1999 IEEE; pp. 1010-1013.
Rubin et al., "Process Architectures Using MeV Implanted Blanket Buried Layers for Latch-Up Imrovements on Bulk Silicon," 1996 Proceedings of the 11th International Conference on Ion Implantation Technology; Austin, Texas; © 1997 IEEE; pp. 13-16.
Rubin, L.M., et al., "Process Control Issues for Retrogade Well Implants for Narrow n+/p+ Isolation in CMOS," Proceedings of the 14th International Conference on Ion Implantation Technology, Sep. 22-27, 2002, pp. 17-20.
Voldman, S. et al., "The Influence of Heavily Doped Buried Layer Implants on Electrostatic Discharge (ESD), Latchup, and a Silicon Germanium Heterojunction Bipolar Transistor in a BiCMOS SiGe Technology," 42nd Annual Reliability Physics Symposium Proceedings, 2004, Publication Date: Apr. 25-29, 2004, IEEE International, pp. 143-151.
Wolf, S. and Tauber, R.N., "Silicon Processing for the VLSI Era, vol. 1: Process Technology", Published by Lattice Press in 2000, pp. 256-259; 406 and 407.
Ziegler, J.F., et al., "IBM Experiments in Soft Fails in Computer Electronics (1978-1994)," IBM J. Res. Develop., vol. 40, No. 1, Jan. 1996, © 1996 by IBM, pp. 3-18.

\* cited by examiner

Fig. 13A
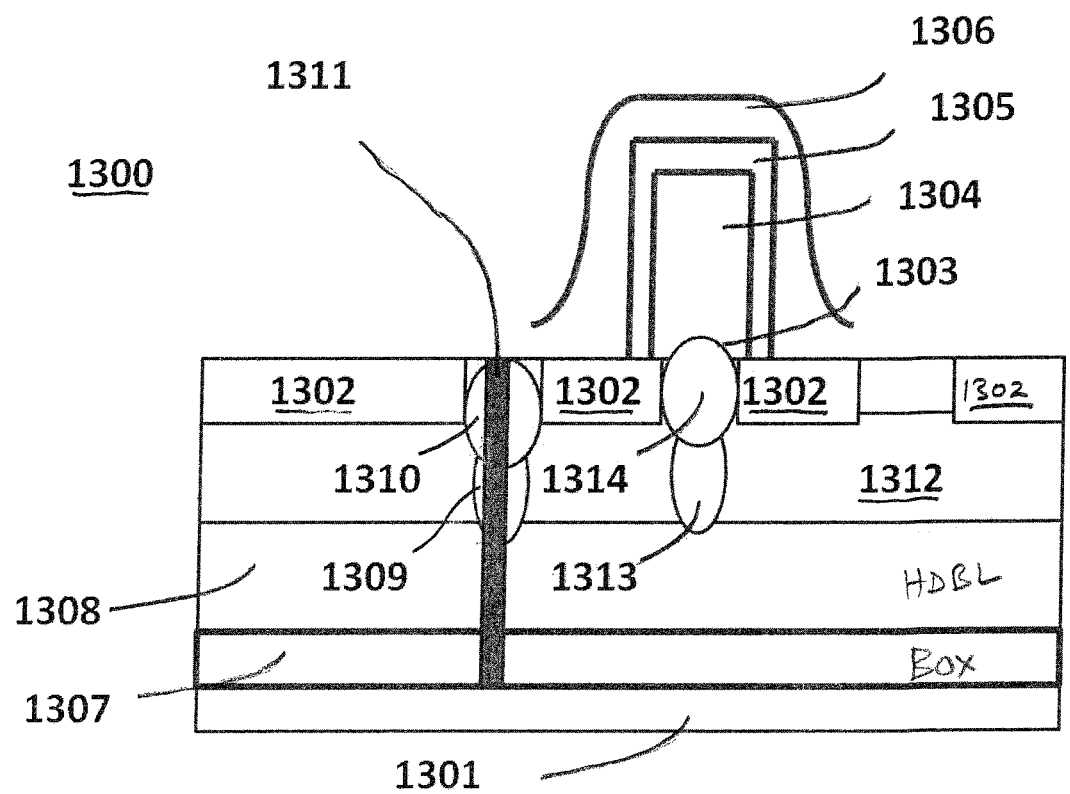
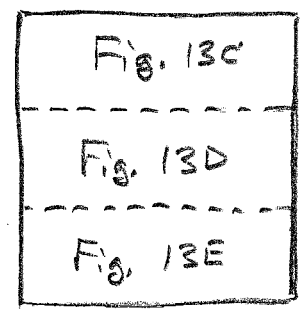
FIG. 13B

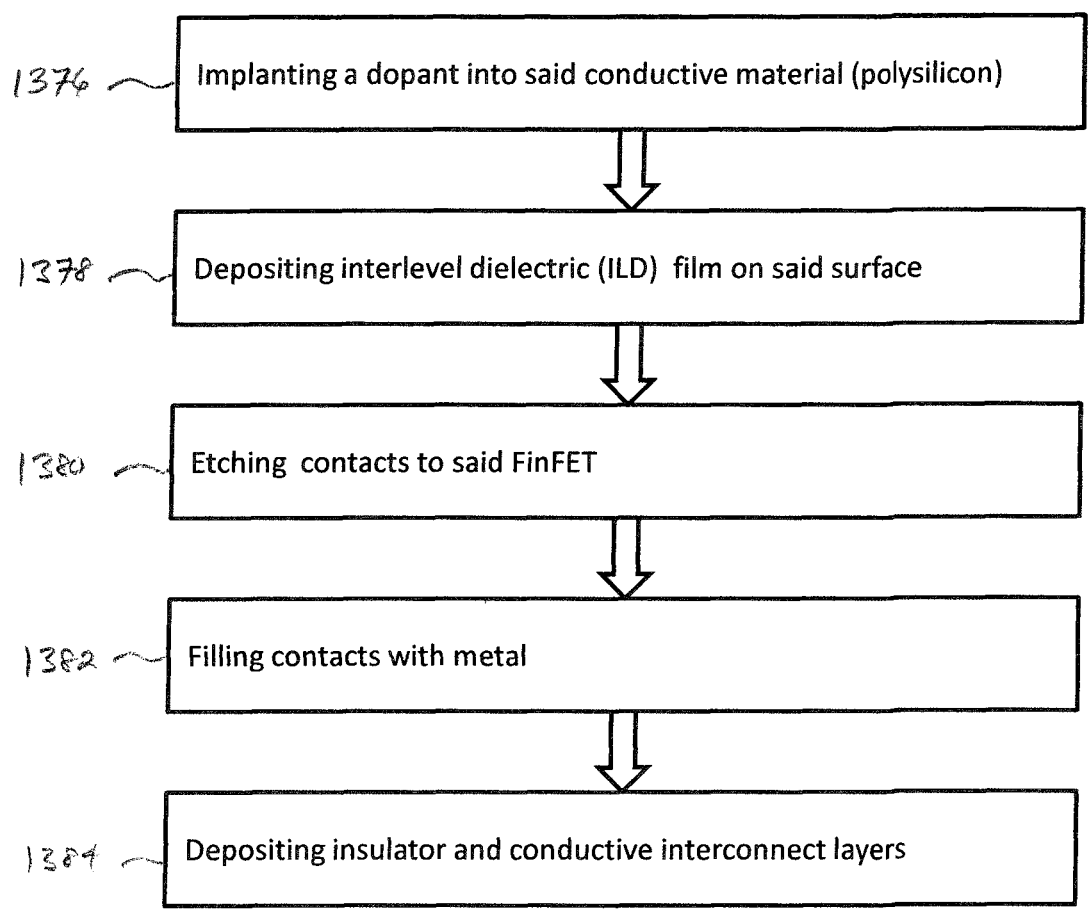

Fig. 14     1400

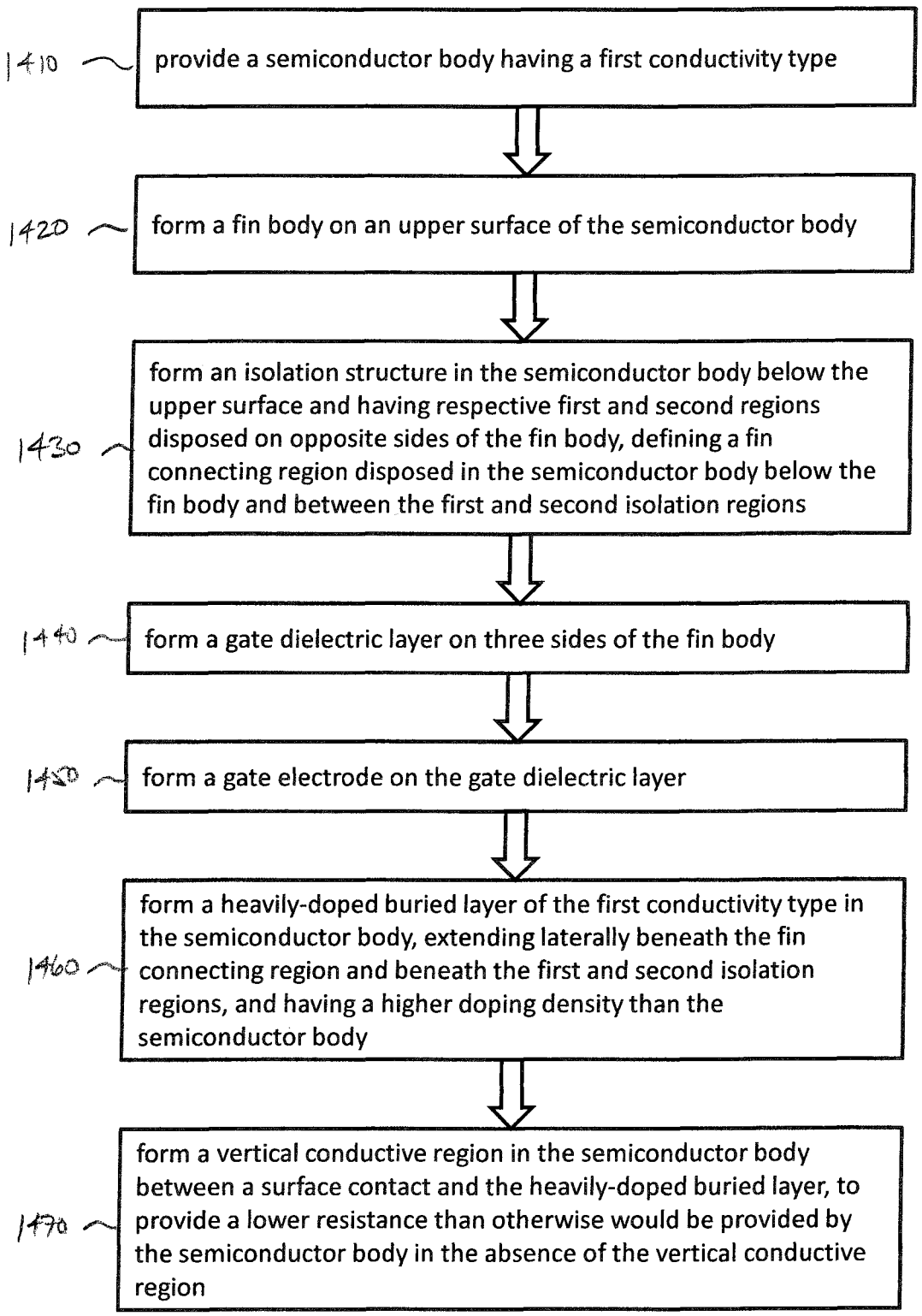

1410 — provide a semiconductor body having a first conductivity type

1420 — form a fin body on an upper surface of the semiconductor body

1430 — form an isolation structure in the semiconductor body below the upper surface and having respective first and second regions disposed on opposite sides of the fin body, defining a fin connecting region disposed in the semiconductor body below the fin body and between the first and second isolation regions 1440 — form a gate dielectric layer on three sides of the fin body 1450 — form a gate electrode on the gate dielectric layer 1460 — form a heavily-doped buried layer of the first conductivity type in the semiconductor body, extending laterally beneath the fin connecting region and beneath the first and second isolation regions, and having a higher doping density than the semiconductor body 1470 — form a vertical conductive region in the semiconductor body between a surface contact and the heavily-doped buried layer, to provide a lower resistance than otherwise would be provided by the semiconductor body in the absence of the vertical conductive region

METHOD FOR FORMING FINFET DEVICE STRUCTURE

CROSS-REFERENCE TO RELATED APPLICATION(S)

This application is a continuation of U.S. application Ser. No. 15/252,920, filed Aug. 31, 2016, entitled FINFET DEVICE STRUCTURE AND METHOD FOR FORMING SAME, now issued as U.S. Pat. No. 10,038,058, which application claims the benefit of U.S. Provisional Application No. 62/333,176, filed May 7, 2016, entitled FINFET DEVICE STRUCTURE AND METHOD FOR FORMING SAME, which applications are incorporated by reference herein in their entirety for all purposes.

TECHNICAL FIELD

The disclosure relates generally to a FinFET device structure and related fabrication method, and more particularly, to a FinFET device having improved reliability.

BACKGROUND

With the scaling of metal oxide semiconductor field effect transistors (MOSFET), MOSFETs physical dimensions have been reduced to maintain dimensional similitude and reliability. MOSFET constant electric field scaling theory requires the physical scaling of dimensions to maintain a constant reliability of the MOSFET gate dielectric. To maintain scaling of the transistor, the three-dimensional FinFET was introduced in advanced technology nodes.

FinFET structures have been proposed for both bulk CMOS and silicon on insulator (SOI) technology. In these advanced technology nodes, reliability is a concern in the FinFET devices. Reliability concerns in FinFETs include hot electron, drain induced barrier lowering (DIBL), gate induced drain leakage (GIDL), latchup, electrostatic discharge (ESD), electrical overstress (EOS), electromigration (EM), and detrimental effects associated with radiation. Radiation effects can include total dose gamma radiation degradation, total ionizing dose (TID), single event upsets (SEU), single event latchup (SEL), and single event gate rupture (SEGR). These reliability issues that occur in CMOS MOSFETs also occur in FinFET structures.

Radiation effects can occur from both radioactivity of naturally occurring materials used in semiconductors. Alpha particles are generated from the radioactive decay from uranium and thorium isotopes in materials used in semiconductor electronics (e.g. aluminum, silicon, lead). Cosmic rays create single event failures in both space and terrestrial environments. Cosmic rays include neutrons, protons, and muons. Neutrons can interact with the boron atoms used in borophosphosilicate glass (BPSG) back end of line (BEOL) materials. Cosmic rays introduce silicon recoil events, and silicon fission in the semiconductor substrate, leading to ionizing tracks. Ionizing tracks generate electron hole pair generation influencing FinFET devices. Heavy ions in space environments can lead to single event latchup (SEL). Ionizing radiation occurs naturally in the form of high-energy photons or charged particles that possess enough energy to break atomic bonds and create electron hole pairs in an absorbing material. These particles can include protons, electrons, atomic ions, and photons with energies greater than a bandgap of the absorbing material. When typical integrated circuits, such as FinFET integrated circuits, are exposed to the charged particles over a period of months or even years, the ionizing radiation can contribute to a total ionizing dose (TID). For example, as an ionizing particle passes through a FinFET device, it generates one or more electron-hole pairs which can be trapped in the gate oxides and the field oxides. Electrons in the semiconductor's valence band are raised to the conduction band. A fraction of the electron-hole pairs will undergo initial recombination and cause no damage, but such recombination decreases as the electric field increases, and the electrons and holes that survive it are free to diffuse and drift within the oxide where they will be swept from the insulator, recombine, or be trapped.

FinFET structures in bulk CMOS have small channel regions where self-heating occurs in the channel region. The physical separation from the silicon substrate prevents thermal transfer of the Joule heating to the bulk substrate. The region between the FinFET channel and the substrate adds thermal resistance leading to self-heating of the FinFET structures. The self-heating of the FinFET structure can lead to reliability concerns in the semiconductor chip.

FIG. 1 illustrates a prior art FinFET structure 100 formed on a lightly-doped p-type substrate 101. A fin structure 113 includes a fin body 104 disposed on and extending above the upper surface 114 of the substrate 101. An isolation structure 102 is formed below the upper surface 114 of the substrate 101, and includes respective isolation regions 102A, 102B disposed on opposite sides of the fin body 104. The isolation structure 102 is also known as shallow trench isolation (STI), which is typically planar with the silicon surface in a planar MOSFET technology. A fin connecting region 103 is disposed in the substrate 101 below the fin body 104 and between the isolation regions 102A, 102B. A gate dielectric layer 105 is disposed on three sides of the fin body 104, and a gate electrode 106 is disposed on the gate dielectric layer 105 (i.e., wrapping around three sides of the fin body 104). A P+ substrate contact 107 provides contact to a well region 112 underlying the isolation structure 102 and the fin structure 113. The substrate contact 107 is formed through the isolation structure 102, which is shown in this cross-sectional view as passing through adjoining isolation regions 102. In the case of an n-channel FinFET, the substrate contact and the well region is p-type. In the case of a p-channel FinFET structure, the well region 112 and substrate contact 107 are n-type. Frequently both an n-type FinFET and a p-type FinFET structure are integrated on the same substrate. Each type is placed in the respective well and contact structures. A FinFET may be constructed in a technology without a well region, or with a single well (e.g., n-well), or with a dual well (e.g., n-well and p-well), or with a triple well (e.g., a p− epi region isolated from the p-substrate by a n+ region). The presence of the isolation structure 102 increases the thermal resistance of the FinFET structure, leading to self-heating in the FinFET fin body 104. The isolation regions 102A, 102B may be tapered (as shown at edge 115) to provide lower electrical and thermal series resistance from the fin connecting region 103 to the underlying substrate 101. Increased taper angle of the isolation regions 102A, 102B increases the spacing between two adjacent fin 113 structures (i.e., fin-to-fin spacing). With the trend to lower-doped substrate wafers, both the electrical resistance and the thermal resistance increase with each technology generation.

FIG. 2 illustrates a prior art FinFET structure 200 formed on a silicon on insulator (SOI) substrate 201. A fin structure 213 includes a fin body 204 disposed on and extending above the upper surface 214 of the substrate 201. An isolation structure 202 is formed below the upper surface 214 of the substrate 201, and includes respective isolation regions 202A, 202B disposed on opposite sides of the fin body 204. A fin connecting region 203 is disposed in the substrate 201 below the fin body 204 and between the isolation regions 202A, 202B. The fin connecting region 203 extends vertically from the upper surface 214 of the substrate 201 to the bottom surface 216 of the isolation structure 202. The fin body 204 is the active region of the FinFET device and is surrounded on three sides by a gate dielectric layer 205 disposed on the fin body 204. A gate electrode 206 is disposed on the gate dielectric layer 205, wrapping around three sides of the fin body 204. A P+ substrate contact region 215 is formed through the isolation structure 202 and provides contact to a well region 209 underlying the isolation structure 202 and the fin structure 213. The presence of the isolation structure 202 increases the thermal resistance of the fin connecting region 203, and leads to increased self-heating in the FinFET fin body 104. Tapering the isolation regions 202A, 202B (and thus tapering the fin connecting region 203) lowers the thermal resistance, but negatively impacts the spacing of adjacent FinFET fingers (e.g. fin-to-fin spacing), leading to a lower circuit density. A buried oxide (BOX) layer 207 is formed in the substrate 201. A substrate contact 208 penetrates through an opening in the isolation structure 202 and extends downward through the well layer 209 and through the buried oxide layer 207 to reach the underlying substrate 201. The substrate contact 208 may utilize a doped polysilicon pillar formed in a trench. The well region 209 disposed at a depth between the isolation structure 202 and the buried oxide layer 207 may contain appropriate dopants forming a single well, a dual well, or a triple well structure. The substrate contact 208 may be electrically isolated from the region 209 by an isolating edge (e.g. dielectric isolation) or an ohmic contact to region 209.

FinFET structures formed in silicon on insulator (SOI) substrate have a buried oxide region 207, further separating the FinFET device active channel region from the silicon substrate. The thermal resistance from the FinFET to the bulk substrate is significantly increased because of the buried oxide structure. The self-heating is a function of the thickness of the buried oxide region. With a thick buried oxide region, the fin body temperature can increase due to self-heating from ambient temperature (e.g. T=300 K) to T=400 K. This can be detrimental to the reliability of the SOI FinFET structure. With the thermal resistance of the fin connecting region 203, the buried oxide layer 207, and the substrate 201, self-heating is a significant concern for 25 nm, 14 nm, 7 nm and 3 nm FinFET devices. Lower doped substrate wafers increases the thermal resistance to the contact structures to remove the Joule heating power generated in the FinFET structure.

CMOS latchup can also occur between a P-type FinFET, and an N-type FinFET. Parasitic bipolar transistors exist in CMOS associated with the parasitic device between the p-type FinFET diffusions, and the n-type FinFET diffusions. Isolation structures help reduce the lateral bipolar current gain between FinFET structures lowering the lateral bipolar current gain. With the tapering of the edges of the isolation, the CMOS latchup immunity is degraded. Hence, to reduce the thermal resistance in the connecting region, the self-heating is lowered, but this degrades the latchup immunity. Initiation of CMOS latchup can occur from electrical overshoot, or single events. Latch-up generally, and in the case of circuits in radiation environments SEL, is a serious failure mode in CMOS circuits. In the best case, latch-up results in soft failure with a loss of data or logic state. In the worst case, latch-up causes a destructive hard failure with permanent loss of the circuit. Thus, from a circuit reliability perspective, latch-up is to be avoided at all costs. As isolation widths shrink, device structures become even more susceptible to both latch-up failure modes.

As noted above, radiation environments present special problems to CMOS circuits in that high-energy particles form electron-hole pairs (EHP) generation in silicon and in the bulk substrate. The instantaneous generation of electron hole pairs deposited by a high-energy particle passing through an IC can immediately induce large displacement currents on the pico-second time scale accompanied with rapid potential shifts away from initial logic states. The deposition of energy by the particle typically causes diodes to forward bias, followed by large transient injection currents which reinforce the transient upset and can cause the CMOS circuit to latch-up.

Additionally, with the widening of the connecting region, more electron-hole pairs (EHPs) are collected in the connecting region of the FinFET, increasing the sensitivity of FinFETs to radiation events.

FinFET sensitivity to transient responses is key in future technology generations. These can include noise, ESD, EOS, and EMC events. Additionally, it is critical for single event upset (SEU) prevention that the circuitry is responsive to transient events to avoid change of circuitry logic states.

Further improvements in FinFET structures for bulk CMOS and for silicon on insulator (SOI) are desired.

SUMMARY

FinFET devices with improved reliability are disclosed. In one example embodiment, a FinFET includes a substrate wafer, a fin body above the planar surface of said substrate wafer, an isolation structure from the planar surface of said substrate wafer forming a fin body connecting region, a gate dielectric on said fin body extending above the silicon substrate surface, a FinFET gate electrode on said gate dielectric, a heavily-doped buried layer (HDBL) in said substrate wafer, extending under said fin body connecting region, and under the fin body, and, a vertical connecting implant extending from the substrate wafer surface to the heavily-doped buried layer and within close proximity of the fin.

In another example embodiment, a FinFET device includes a substrate wafer, a fin body above the planar surface of said substrate wafer, an isolation structure from the planar surface of said substrate wafer forming a fin body connecting region, a gate dielectric on said fin body extending above the silicon substrate surface, a FinFET gate electrode on said gate dielectric, a heavily-doped buried layer in said substrate wafer, extending under said fin body connecting region, and under the fin body, a vertical connecting implant extending from the substrate wafer surface to the heavily-doped buried layer and within proximity of the fin, as well as a fin body-to-buried layer connecting implanted region placed under the fin body in the fin body connecting region connecting the fin body to the heavily-doped buried layer therebelow.

In another example embodiment, a FinFET includes a substrate wafer, a buried oxide layer in the substrate, an SOI vertical contact extending through the buried oxide layer, a fin body on the substrate wafer, an isolation structure from the planar surface of the substrate wafer forming a fin body connecting region, extending from the substrate wafer surface to the bottom of the isolation structure, a gate dielectric on the fin body extending above said isolation structure, a FinFET gate electrode on the gate dielectric, a heavily-doped buried layer in the substrate wafer above the buried oxide layer and coupled to the SOI contact; and a vertical connecting implant connecting said substrate wafer surface to the SOI vertical contact. In an additional embodiment, extending under said fin body connecting region, and under the fin body, a fin body-to-buried layer connecting implanted region placed under the fin body in the fin body connecting region connecting the fin body to the heavily-doped buried layer.

In another example embodiment, a method of forming a FinFET structure includes: (a) providing a substrate comprising a fin at a surface of the substrate; (b) implanting a heavily-doped buried layer in the substrate under the fin; (c) forming an isolation regions on opposite sides of the fin wherein the bottom surface of a fin is level with top surfaces of the isolation regions and an substrate contact region; (d) forming a gate dielectric on the fin; (e) forming a FinFET gate electrode on the gate dielectric; (f) implanting a first dopant vertical connecting implant in the substrate contact region of a depth to extend to the heavily-doped buried layer; and (g) implanting a second dopant in the substrate contact region to connect from the substrate surface to the first dopant vertical connecting implant.

In one aspect a FinFET device is provided. In an example embodiment, a FinFET device includes a semiconductor body having a first conductivity type and having an upper surface, and includes a fin body disposed on the upper surface of the semiconductor body. The FinFET also includes an isolation structure disposed in the semiconductor body below the upper surface and having respective first and second regions disposed on opposite sides of the fin body; a fin connecting region disposed in the semiconductor body below the fin body and between the first and second isolation regions; a gate dielectric layer disposed on three sides of the fin body; a gate electrode disposed on the gate dielectric layer; a heavily-doped buried layer of the first conductivity type disposed in the semiconductor body, extending laterally beneath the fin connecting region and beneath the first and second isolation regions, and having a higher doping density than the semiconductor body. The device can also include a vertical conductive region disposed in the semiconductor body between a surface contact and the heavily-doped buried layer, and providing a lower resistance than otherwise would be provided by the semiconductor body in the absence of the vertical conductive region.

In some embodiments, the FinFET device may also include a buried oxide (BOX) layer disposed in the semiconductor body below the isolation structure; and a substrate contact pillar extending from the semiconductor surface, through the BOX layer, and to the semiconductor body below the BOX layer. In some embodiments, the substrate contact pillar may be laterally disposed within the vertical conductive region to thereby form an integrated vertical contact structure.

In some embodiments, the FinFET device may also include a third implanted region of the first conductivity type extending from the fin body downward into the fin connecting region. The third implanted region may extend through the fin connecting region and to the heavily-doped buried layer.

In some embodiments, the respective first and second isolation structure regions each have a substantially vertical sidewall adjoining the fin connecting region.

In another example embodiment, a FinFET device includes a semiconductor body having a first conductivity type and having an upper surface; a fin body disposed on the upper surface of the semiconductor body; an isolation structure disposed in the semiconductor body below the upper surface and having respective first and second regions disposed on opposite sides of the fin body; a fin connecting region disposed in the semiconductor body below the fin body and between the first and second isolation regions; a gate dielectric layer disposed on three sides of the fin body; a gate electrode disposed on the gate dielectric layer; a heavily-doped buried layer of the first conductivity type disposed in the semiconductor body, extending laterally beneath the fin connecting region and beneath the first and second isolation regions, and having a higher doping density than the semiconductor body; a vertical conductive region disposed in the semiconductor body between a surface contact and the heavily-doped buried layer, and providing a lower resistance than otherwise would be provided by the semiconductor body in the absence of the vertical conductive region; a buried oxide (BOX) layer disposed in the semiconductor body and extending laterally beneath the fin connecting region and beneath the first and second isolation regions; and a substrate contact pillar extending from the semiconductor surface, through the BOX layer, and to the semiconductor body below the BOX layer, said substrate contact pillar being laterally disposed within the vertical conductive region to thereby form an integrated vertical contact structure.

In another example embodiment, a FinFET device includes a semiconductor body having a first conductivity type and having an upper surface; a fin body disposed on the upper surface of the semiconductor body; an isolation structure disposed in the semiconductor body below the upper surface and having respective first and second regions disposed on opposite sides of the fin body; a fin connecting region disposed in the semiconductor body below the fin body and between the first and second isolation regions; a gate dielectric layer disposed on three sides of the fin body; a gate electrode disposed on the gate dielectric layer; a buried oxide (BOX) layer disposed in the semiconductor body and extending laterally beneath the fin connecting region and beneath the first and second isolation regions; a vertical conductive region disposed in the semiconductor body between a surface contact and the BOX layer, and providing a lower resistance than otherwise would be provided by the semiconductor body in the absence of the vertical conductive region; and a substrate contact pillar extending from the semiconductor surface, through the BOX layer, and to the semiconductor body below the BOX layer, said substrate contact pillar being laterally disposed within the vertical conductive region to thereby form an integrated vertical contact structure.

In another aspect, a method for making a FinFET device is provided. In an example embodiment, the method includes providing a semiconductor body having a first conductivity type; forming a fin body on an upper surface of the semiconductor body; forming an isolation structure in the semiconductor body below the upper surface and having respective first and second regions disposed on opposite sides of the fin body, defining a fin connecting region disposed in the semiconductor body below the fin body and between the first and second isolation regions; forming a gate dielectric layer on three sides of the fin body; forming a gate electrode on the gate dielectric layer; forming a heavily-doped buried layer of the first conductivity type in the semiconductor body, extending laterally beneath the fin connecting region and beneath the first and second isolation regions, and having a higher doping density than the semiconductor body. The method can also include forming a vertical conductive region in the semiconductor body between a surface contact and the heavily-doped buried layer, and providing a lower resistance than otherwise would be provided by the semiconductor body in the absence of the vertical conductive region.

In another example embodiment, the method includes providing a semiconductor body having a first conductivity type and having an upper surface; forming a fin body on the upper surface of the semiconductor body; forming an isolation structure disposed in the semiconductor body below the upper surface and having respective first and second regions disposed on opposite sides of the fin body, defining a fin connecting region disposed in the semiconductor body below the fin body and between the first and second isolation regions; forming a gate dielectric layer on three sides of the fin body; forming a gate electrode on the gate dielectric layer; forming a heavily-doped buried layer of the first conductivity type in the semiconductor body, extending laterally beneath the fin connecting region and beneath the first and second isolation regions, and having a higher doping density than the semiconductor body; forming a vertical conductive region in the semiconductor body between a surface contact and the heavily-doped buried layer, and providing a lower resistance than otherwise would be provided by the semiconductor body in the absence of the vertical conductive region; forming a buried oxide (BOX) layer in the semiconductor body and extending laterally beneath the fin connecting region and beneath the first and second isolation regions; and forming a substrate contact pillar extending from the semiconductor surface, through the BOX layer, and to the semiconductor body below the BOX layer, said substrate contact pillar being laterally disposed within the vertical conductive region to thereby form an integrated vertical contact structure.

In another example embodiment, the method includes providing a semiconductor body having a first conductivity type and having an upper surface; forming a fin body on the upper surface of the semiconductor body; forming an isolation structure in the semiconductor body below the upper surface and having respective first and second regions on opposite sides of the fin body, defining a fin connecting region in the semiconductor body below the fin body and between the first and second isolation regions; forming a gate dielectric layer on three sides of the fin body; forming a gate electrode on the gate dielectric layer; forming a buried oxide (BOX) layer in the semiconductor body and extending laterally beneath the fin connecting region and beneath the first and second isolation regions; forming a vertical conductive region in the semiconductor body between a surface contact and the BOX layer, and providing a lower resistance than otherwise would be provided by the semiconductor body in the absence of the vertical conductive region; and forming a substrate contact pillar extending from the semiconductor surface, through the BOX layer, and to the semiconductor body below the BOX layer, said substrate contact pillar being laterally disposed within the vertical conductive region to thereby form an integrated vertical contact structure.

The foregoing is a summary and thus contains, by necessity, simplifications, generalizations and omissions of detail. The details of various implementations are set forth in the accompanying drawings and the description below. Consequently, those skilled in the art will appreciate that the foregoing summary is illustrative only and is not intended to be in any way limiting of the invention. It is only the claims, including all equivalents, in this or any non-provisional application claiming priority to this application, that are intended to define the scope of the invention(s) supported by this application.

BRIEF DESCRIPTION OF THE DRAWINGS

The present disclosure and the corresponding advantages and features provided thereby will be best understood and appreciated upon review of the following detailed description of the disclosure, taken in conjunction with the following drawings, where like numerals represent like elements, in which:

FIG. 14 illustrates a method of forming a FinFET structure in accordance with the first embodiment of the disclosure.

DETAILED DESCRIPTION

Figure 1:
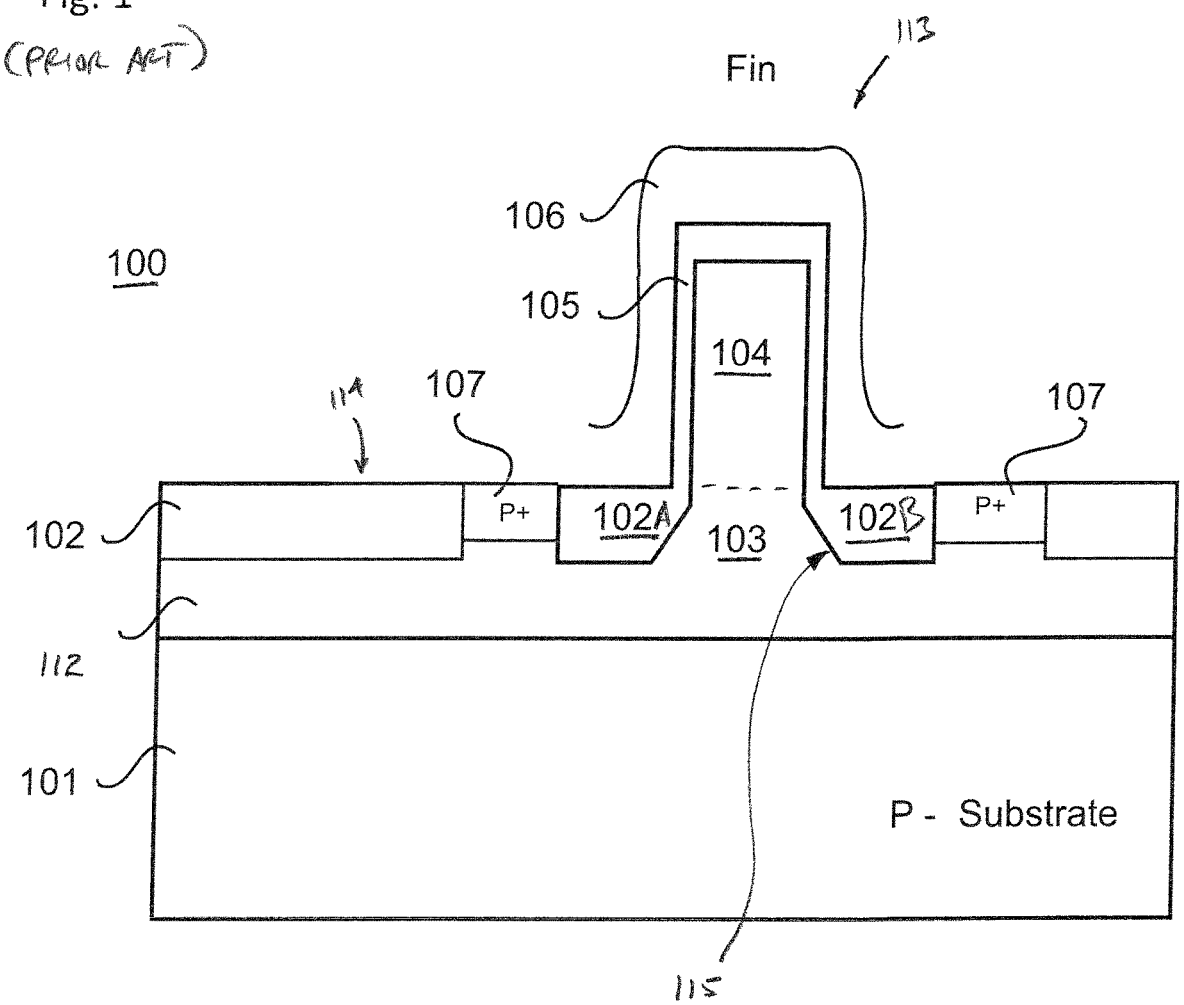
FIG. 1 depicts a prior art embodiment of a FinFET in a bulk substrate.
Figure 2:
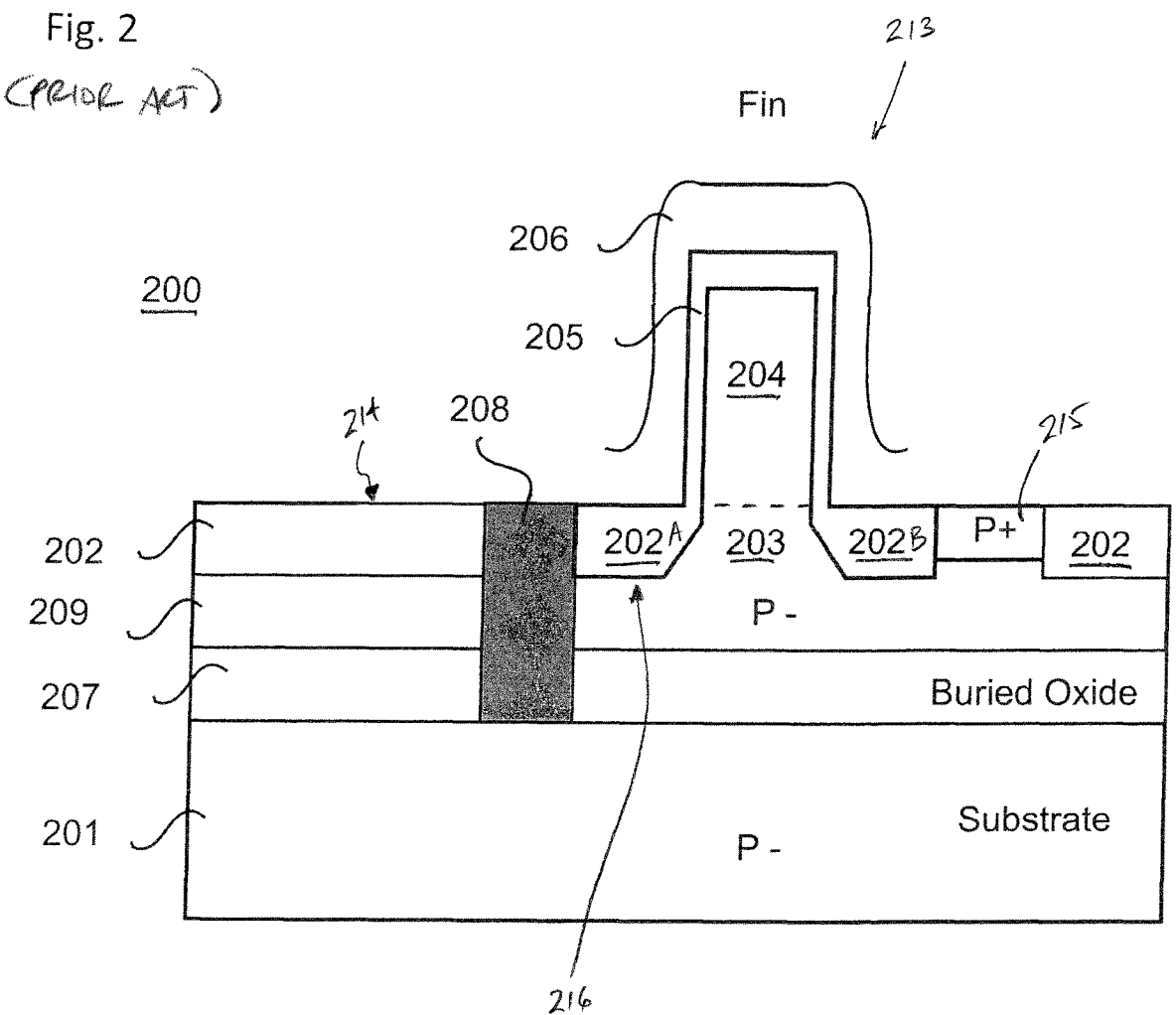
FIG. 2 depicts a prior art embodiment of a FinFET in a silicon on insulator (SOI) substrate.

Referring now to the drawings, wherein like reference numbers are used herein to designate like elements throughout, the various views and embodiments of a FinFET device and methods are illustrated and described, and other possible embodiments are described. The figures are not necessarily drawn to scale, and in some instances the drawings have been exaggerated and/or simplified in places for illustrative purposes only. One of ordinary skill in the art will appreciate the many possible applications and variations based on the following examples of possible embodiments.

Figure 3:
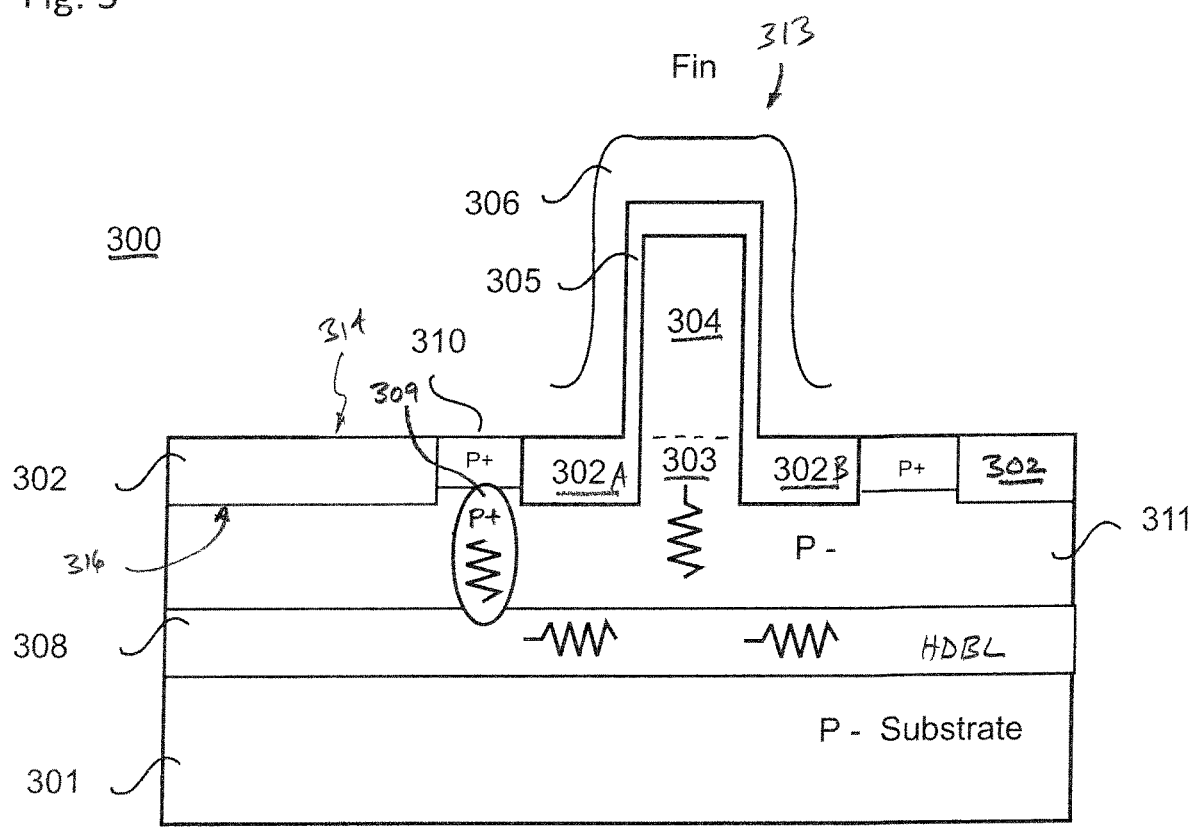
FIG. 3 depicts a FinFET structure in accordance with a first embodiment of the disclosure.

FIG. 3 illustrates a FinFET 300 in accordance with a first embodiment of the disclosure. The FinFET 300 is formed on a substrate 301. A fin structure 313 includes a fin body 304 disposed on and extending above the upper surface 314 of the substrate 301. An isolation structure 302 is formed below the upper surface 314 of the substrate 301, and includes respective isolation regions 302A, 302B disposed on opposite sides of the fin body 304. A fin connecting region 303 is disposed in the substrate 301 below the fin body 304 and between the isolation regions 302A, 302B. The fin connecting region 303 extends vertically from the upper surface 314 of the substrate 201 to the bottom surface 316 of the isolation structure 302. The fin body 304 is surrounded on three sides by a gate dielectric layer 305 disposed on the fin body 304. A gate electrode 306 is disposed on the gate dielectric layer 305, wrapping around three sides of the fin body 304. A heavily-doped buried layer 308 is disposed in the substrate 301 below the isolation structure 302 and the fin structure 313, and extends laterally beneath the fin connecting region 303 and at least the isolation regions 302A, 302B. The heavily-doped buried layer 308 has a higher doping density than does the substrate 301 (i.e., in that region of the substrate). An implanted region 309 extends upward from the heavily-doped buried layer 308, toward the upper surface 314 of the isolation structure 302. A second implanted region 310 overlaps the implanted region 309 and extends upward to the surface 314 to form a lower resistance shunt for the heavily-doped buried layer 308. The implanted regions 309, 310 may be viewed as together forming a vertical conductive region between a surface contact and the heavily-doped buried layer 308, which provides a lower resistance than otherwise would be provided in the absence of the implanted regions 309, 310. The implanted regions 309 and 310 can be integrated with a p+ substrate contact of the FinFET structure 300 to form a single low resistance path to the heavily-doped buried layer 308 and to the substrate 301. Region 311 (of the substrate 301) may include p-well implants abutting the heavily-doped buried layer 308 and vertical implanted regions 309 and 310. Region 311 can include a p-well implant for an n-channel FinFET, or an n-well implant for a p-channel FinFET structure. The n-well and p-well implants can abut (i.e., touch each other) in CMOS FinFET technology at the edges thereof under the isolation structure 302. The well implants placed in region 311 can abut the trench isolation on the top surface, and can abut the heavily-doped buried layer on the lower surface. A FinFET includes at least one fin structure, but may include a plurality of fin structures contained within a common well structure, as described in more detail herebelow in regards to FIG. 10 and FIG. 11. For an n-type FinFET, a plurality of n-type fins is contained within a common p-region, which can be p– epitaxial region, or a p-well. For a p-type FinFET, a plurality of p-type fins are contained within a common n– region, which can be n– epitaxial region, or an n-well. The heavily-doped buried layer 308 preferably extends beneath the plurality of fins for either a p-type FinFET or an n-type FinFET.

In the example of FIG. 3, heavily-doped buried layer 308 is a heavily doped region of the same conductivity type as the substrate (in this example, a p– substrate), having a higher doping density than the substrate, and is placed beneath the active device regions of the device by ion implantation. In general, both the doping and damage characteristics of the heavily-doped buried layer influence device performance. Heavily-doped buried layer structures are easily integrated into standard CMOS processing with the addition of typical steps such as, an implant step, a rapid thermal anneal (RTA), and an optional cleaning step in between the implant and anneal. The process steps associated with the heavily-doped buried layer can be performed either before or after dielectric isolation (SiO$_2$) formation either by LOCOS or the use of a shallow trench isolation (STI) structure common in many CMOS processes. While a variety of different impurities can be used, preferable implants are boron implanted at 1.0-2.5 MeV (for p-type substrates), and phosphorus at 1.5-3.5 MeV (for n-type substrates). If a wafer-normal to ion implant beam angle of zero degrees is set during ion implantation, the necessary energy to achieve a desired depth of the ion implant can be significantly reduced. Implanted doses may vary between $1\times10^{13}$ and $5\times10^{15}$ cm$^{-2}$, which forms a highly doped and abrupt layer approximately 1.0-5.0 µm below the silicon surface. The buried layer peak doping concentration can range from $1\times10^{17}$ cm$^{-3}$ to $5\times10^{21}$ cm$^{-3}$. The heavily-doped buried layer 308 is typically implanted sufficiently deep so that the final dopant profile (after all thermal processes) does not counter-dope the retrograde well of opposite conductivity, which would result in undesirable low well-substrate breakdown voltage. For example, a CMOS twin well process includes a heavily-doped buried layer (e.g., boron with an implant energy of 1.7 MeV and a dose of $1\times10^{15}$ cm$^{-2}$ forming a blanket p+ buried layer).

For example, in the case of FIG. 3 where the substrate is p– doped, the deep p+ layer provides a heavily-doped buried layer low resistance shunt 308 that significantly reduces the series resistance between the parasitic pnp sub-collector (below the n-well) and the p+ collector ($V_{SS}$). Forming a HDBL p+ shunting layer 308 via implantation also gives circuit designers the option of patterning the implant to independently optimize substrate resistivity in different areas, e.g., for a system-on-chip design. Thus, substrate resistance is now significantly reduced, typically by more than two orders of magnitude, because of the presence of heavily-doped buried layer 308. The spreading resistance of the region can be lowered to less than 50Ω as compared to 2 kΩ or more for conventional CMOS isolation. However, even with use of the heavily-doped buried layer 308, significant vertical resistance continues to exist, hence the implant regions 309 and 310 may be included to provide a lower resistance path to more effectively sink any collected charge, and also to provide a better thermal path. In a FinFET structure, the electrical and thermal resistance is impacted due to the electrical and thermal resistance of region 303. Shallow trench isolation (STI) negatively impacts the thermal resistance, but at the same time improves the latchup robustness. Tapering of the shallow trench isolation (STI) lowers the self-heating and thus reduces fin-to-fin spacing, but also lowers the latchup robustness. With the presence of the heavily-doped buried layer and its associated vertical conductive region (e.g., implanted regions 309, 310), the amount of tapering of the shallow trench isolation (STI) can be reduced. In some embodiments, the taper may be eliminated altogether, resulting in a substantially vertical sidewall of the isolation regions.

A second step in addressing latch-up and other substrate current transients is to reduce the significant vertical resistance. Addition of a vertical conductor 309 extending between the buried layer 308 and a p-well contact region or some other substrate surface terminal significantly reduces this resistance. In one embodiment, the vertical conductor 309 is formed as a vertical impurity region having the same conductivity type as the substrate, but typically having an impurity concentration greater than that of the substrate. For example, where the substrate is a p– substrate, vertical conductor 309 can be formed from one or more p+ implants into the region extending between p-well contact and buried layer 308. High-energy ion-implantation combined with photoresist masking and/or multiple energy implantation can provide a vertical p+ doped region with high aspect ratio doping profile to bridge the uplink path from an ohmic $V_{SS}$ surface contact or Schottky diode to buried layer 308 or other p+ bulk layers as is typical for p− epi on p+ bulk substrates. For example, in one implementation vertical conductor 309 and 310 is formed by multiple ion-implant steps at one or more energy levels.

When buried layer 308 and vertical conductor 309 are used in conjunction with each other, a new protective structure is formed that offers several isolation attributes. Since the low resistance buried layer is now locally connected via a vertical doping region or other conductor: (1) a lower impedance is provided for most or all of the accumulated, deposited or injected charge occurring within the silicon substrate region; (2) transient times for charge termination are reduced thereby improving overall isolation by reducing or minimizing the duration of any n+/p− diode forward biasing which reduces injected currents; (3) the structure forms a low-resistance circuit leg back to the p-well contact terminal, thereby creating a current divider which effectively shunts and sinks a majority of any injected or deposited current away from the resistor legs, thereby significantly reducing base current feedback to the parasitic npn devices shown and limiting voltage transients for the p− bulk silicon region associated with the CMOS structure. The low resistance structure, by effectively shunting injected current or stray charge promptly to the $V_{SS}$ terminal, reduces or prevents voltage transients which could subsequently forward bias either or both of the n−/p− diodes (n-well/p− substrate diode inherent in CMOS FinFET twin well isolation) and the n+/p− diodes (inherent in NMOS FinFET transistor) and eliminates subsequent triggering of the pnpn SCR FinFET network. Latch-up with the buried layer isolation structure present then becomes difficult or impossible to initiate, thereby preserving the circuit from ever entering destructive latch-up. The three dimensional heavily doped layers extend both horizontally and vertically thus creating low ohmic regions of contiguous and/or connected to isolation doping regions which stand separated from the transistor doping regions.

As can be seen in FIG. 3, the low resistance structure can be integrated into any existing CMOS FinFET twin well isolation structure with no adverse impact to existing structures, thus enabling the improvements necessary to provide robust isolation for both conventional circuit noise initiated latch up and single event latch up. Moreover, the structures and techniques can be used to prevent latch-up in both radiation-hardened and conventional microelectronic circuits.

The low resistance structure and techniques can also be used to reduce or eliminate both single-event upset (SEU) and single-event transient (SET) events. SEU and SET can be caused by a high-energy particle, e.g., a single heavy ion or nuclear particle such as a neutron or alpha particle, passing through a critical node in an IC comprising of FinFET devices. Immediately after being struck by such a particle, electrons and holes will be separated from the silicon lattice as a function of the particle's energy which is expressed as the linear energy transfer (LET Mev/mg-cm) of the particular particle. If the electron-hole pairs generated and ultimately collected as free electrons and holes is greater than the critical charge of a FinFET memory cell or some other state-related device, a single-event upset can occur. The susceptibility of FinFET ICs to single-event upsets typically depends on the amount of critical charge required to "flip" a bit and the probability that a particle with a LET large enough to deposit that critical charge will strike a sensitive node. The production of large numbers of electron-hole pair (EHP) also creates a potential dipole within the particle track passing through the silicon material. The Hall effect segregates the holes and electron charges to opposite sides of the electrostatic field. Some electrons and holes can recombine in the lattice via SRH and Auger mechanisms. However, as a result of their higher mobility, electrons are quickly collected at the positive terminals, whereas the net concentration of holes, which have lower mobility and remain with the silicon body as static charge while unrecombined because of depleted electrons. The positive charges cause the local potential of the p− substrate to increase in voltage to a positive value and continues to influence the local potential of the p− substrate positively for several nanoseconds after the high energy particle strike. As a result of the potential upset within the p− substrate, other unstruck diodes are now activated which creates secondary currents and enhances the initial upset more significantly, an effect often referred to as single event transient (SET). While soft error results in data corruption, it is not destructive to the physical circuit.

Since CMOS FinFET logic typically uses inverter gates and cross coupled logic gates to store binary bits in any digital circuit, the aforementioned devices and techniques will prove useful in reducing SEU and SET. The FinFET with low resistance structure serves a similar role with regards to soft error as in the latch-up isolation. In both cases the structure effectively sinks excess positive charge generated by the upset event, while maintaining node potential, and limiting the transient voltage swing and duration following an SEU, SEL, or SET event.

Figure 4:
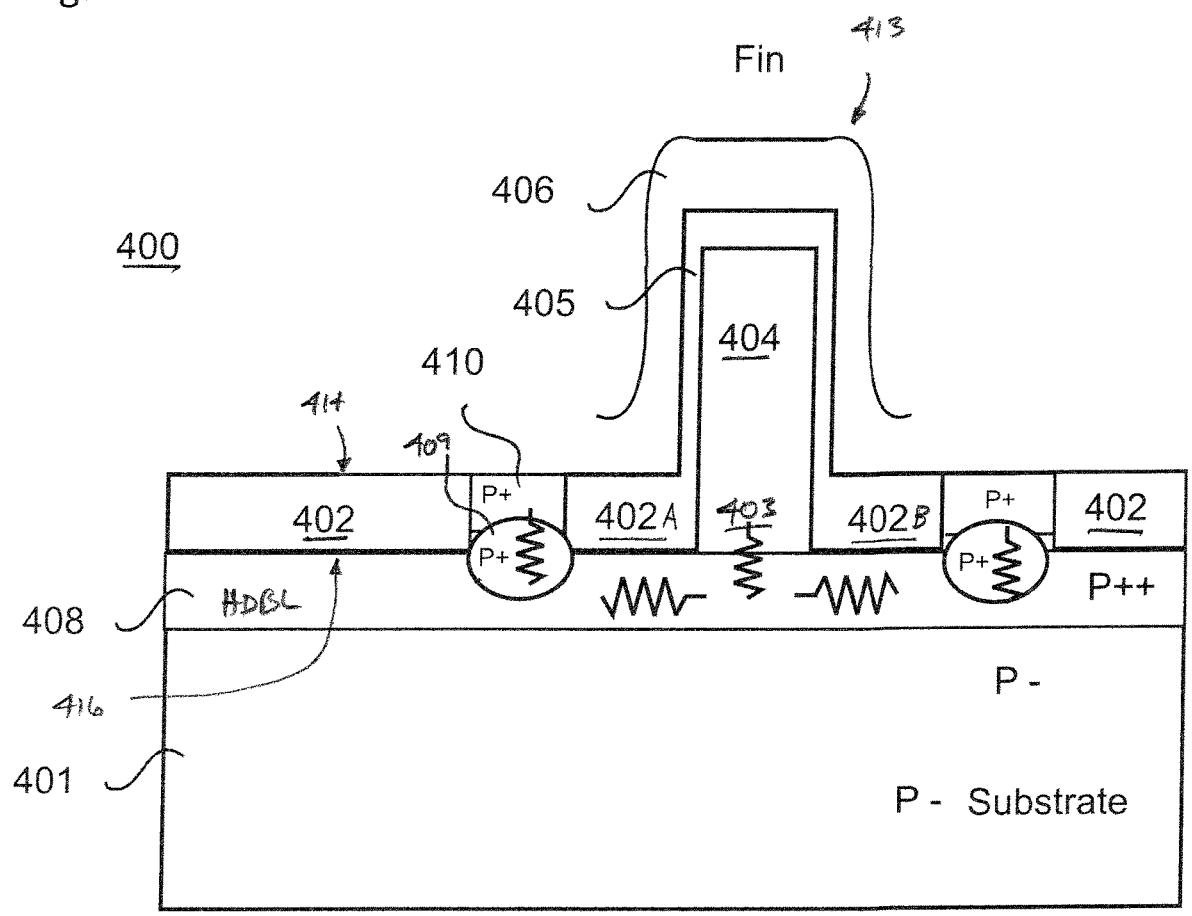
FIG. 4 depicts a FinFET structure in accordance with a second embodiment of the disclosure.

FIG. 4 is a cross-sectional drawing depicting a FinFET structure in accordance with a second embodiment of the disclosure. The FinFET device 400 is formed on a substrate 401. Isolation structure 402 is formed in the substrate 401. A fin body connecting structure has a region 403 between the associated isolation regions 402 in the substrate 401. The fin body 404 extends above the isolation structure 402. The active region, the fin body 404 is surrounded by a gate dielectric 405. A MOSFET gate electrode 406 is formed on the gate dielectric 405 wrapping on three sides the fin body 404. A heavily-doped buried layer 408 is formed in the substrate 401 below the isolation structure 402. The heavily-doped buried layer 408 abuts the isolation structure 402 and abuts fin connecting region 403. An implanted region 409 extends upward from the heavily-doped buried layer 408. A second implanted region 410 extends from the device surface 414 to, and partially overlaps, the implanted region 409 to form a low resistance shunt for the heavily-doped buried layer 408. The implanted regions 409, 410 may be integrated with the p+ substrate contact of the FinFET structure to form a single low resistance path to the substrate 401. The advantage of this structure is that it provides a low electrical and low thermal resistance to the fin body 404. It also introduces a vertical built-in electric field between the fin connecting region 403 and the substrate 401, lowering the minority carrier collection from radiation effects. A p++/p− doping transition lowers the transport of the minority carriers to the fin connecting region 403. In this structure, the implant forming the heavily-doped buried layer 408 may be masked, so that the heavily-doped buried layer 408 is formed only under the p-channel FinFET or only under the n-channel FinFET. In the case where it is placed only under the n-channel FinFET, an n-well is placed under the p-channel FinFET (not shown). By masking the heavily-doped buried layer implant under the p-channel FinFET, the n-well is not counter-doped.

Figure 5:
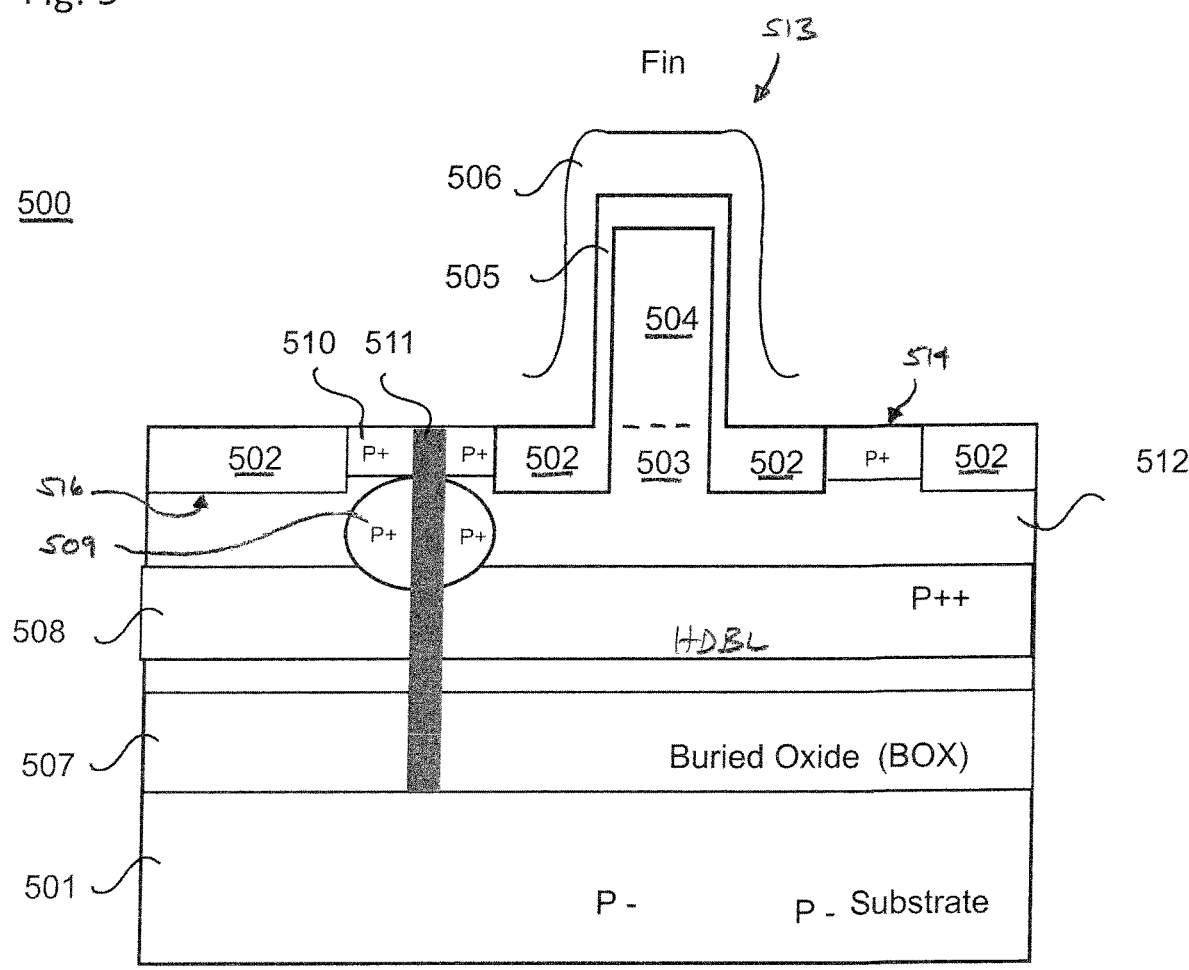
FIG. 5 depicts an SOI FinFET structure and buried oxide in accordance with a third embodiment of the disclosure.

FIG. 5 is a cross-sectional drawing depicting a SOI FinFET in accordance with a third embodiment of the disclosure. The SOI FinFET 500 is formed on a substrate

501. Isolation structure 502 is formed in the substrate 501. A fin structure 513 has a fin connecting region 503 disposed between associated regions of the isolation structure 502 in the substrate 501. The fin body 504 extends above the isolation structure 502. The fin body 504 is surrounded on three sides by a gate dielectric layer 505. A MOSFET gate electrode 506 is formed on the gate dielectric layer 505 wrapping on three sides the fin body 504. A heavily-doped buried layer 508 is formed in the substrate 501 below the isolation structure 502. A buried oxide (BOX) layer 507 is disposed below the heavily-doped buried layer 508. In this embodiment the heavily-doped buried layer 508 does not abut the isolation structure 502 and does not abut the fin connecting region 503. An implanted region 509 extends upward from the heavily-doped buried layer 508. A second implanted region 510 extends from the device surface to, and overlapping, the implanted region 509 to form a lower resistance shunt to the heavily-doped buried layer 508. The implanted regions 509 and 510 can be integrated with the p+ substrate contact of the FinFET structure to form a single low resistance path to both the heavily-doped buried layer and the substrate. Region 512 can contain a p-well region above the heavily-doped buried layer 508. In the case of a dual well technology, an n-well can be formed under a p-type FinFET, and a p-well under a n-type FinFET. Additionally, a SOI contact 511 structure to the bulk wafer below is formed through the buried oxide layer 507. The SOI contact 511 penetrates through the isolation structure 502 (shown in this cross-sectional view as passing between two adjacent isolation regions 502), and through the buried oxide layer 507. This SOI contact 511 may be filled with polysilicon to form a pillar which is doped to provide a low resistance contact. Implanted regions 509 and 510 can be integrated with the SOI contact 511 structure. In other words, the SOI contact 511 may be formed within (or co-extensive with) the vertical conductive region formed by implanted regions 509 and 510. The advantage of this structure is that it provides a low thermal resistance to the fin in a SOI technology, and allows for thermal transfer from the self-heating that occurs in the FinFET device. In some embodiments the SOI contact structure, such as a polysilicon pillar, may have sufficiently low resistance to serve as a vertical contact to both the heavily-doped buried layer and to the bulk wafer (i.e., semiconductor body). The utilization of the heavily-doped buried layer provides transfer of heat from the FinFET channel region to the vertical contact, and at the same time, the buried oxide layer lowers the sensitivity to SEU and SEL. The resulting improved thermal reduction allows for reducing the taper of the isolation structure on the edges of the FinFET connecting region 503.

Figure 6:
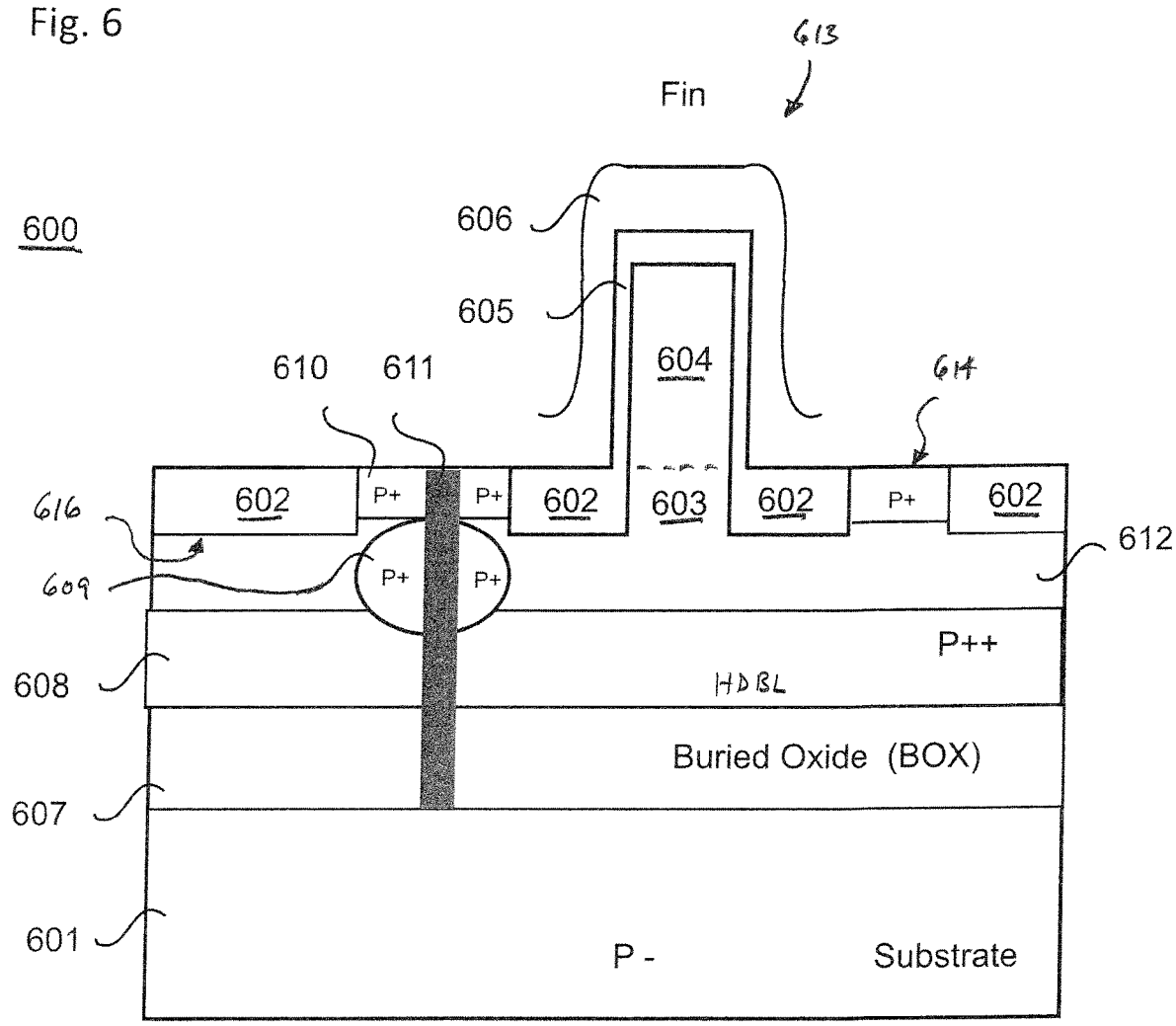
FIG. 6 depicts a SOI FinFET structure in accordance with a fourth embodiment of the disclosure.

FIG. 6 is a cross-sectional drawing depicting a SOI FinFET in accordance with a fourth embodiment of the disclosure. The SOI FinFET 600 is formed on a substrate 601. Isolation structure 602 is formed in the substrate 601. A fin structure has a region 603 referred to as a fin connecting region between adjacent regions of the isolation structure 602 in the substrate 601. The fin body 604 extends above the substrate wafer surface and above the isolation structure 602. The isolation regions 602 on opposite sides of the fin body 604 can be tapered to allow for a lower thermal resistance of fin connecting region 603. The fin body 604 is surrounded on three sides by a gate dielectric 605. A MOSFET gate electrode 606 is formed on the gate dielectric 605 wrapping on three sides the fin body 604. A heavily-doped buried layer 608 is formed in the substrate 601 below the isolation structure 602. A buried oxide (BOX) layer 607 is formed below the heavily-doped buried layer 608. An implanted region 609 extends upward from the heavily-doped buried layer 608. A second implanted region 610 extends from the device surface 614 to, and overlapping, the implanted region 609 to form a low resistance shunt. The implanted regions 609 and 610 can be integrated with the p+ substrate contact of the FinFET structure to form a single low resistance path to the substrate. A region 612 can contain either single well, dual well or triple well regions as described above. Additionally, a SOI contact 611 structure to the bulk wafer below is formed through the buried oxide layer 607. The SOI contact 611 penetrates through the isolation structure 602, and through the buried oxide layer 607. This SOI contact 611 is filled with polysilicon which is doped to provide a low resistance vertical contact. Implanted regions 609 and 610 can be integrated with the SOI contact 611 structure. The advantage of this structure is that it provides a low thermal resistance to the fin in a SOI technology. The buried layer structure allows for thermal transfer from the self-heating formed in the FinFET device. The utilization of the heavily-doped buried layer 608 provides transfer of heat from the FinFET channel region to the contact 611, and at the same time, the buried oxide layer 607 lowers the sensitivity to SEU and SEL. Additionally, due to the high doping concentration of the buried layer 608, the recombination time of minority carriers generated in the FinFET and under the isolation structure 602 is small due to Auger recombination (e.g. Auger recombination is inversely proportional to the square of doping concentration).

Figure 7:
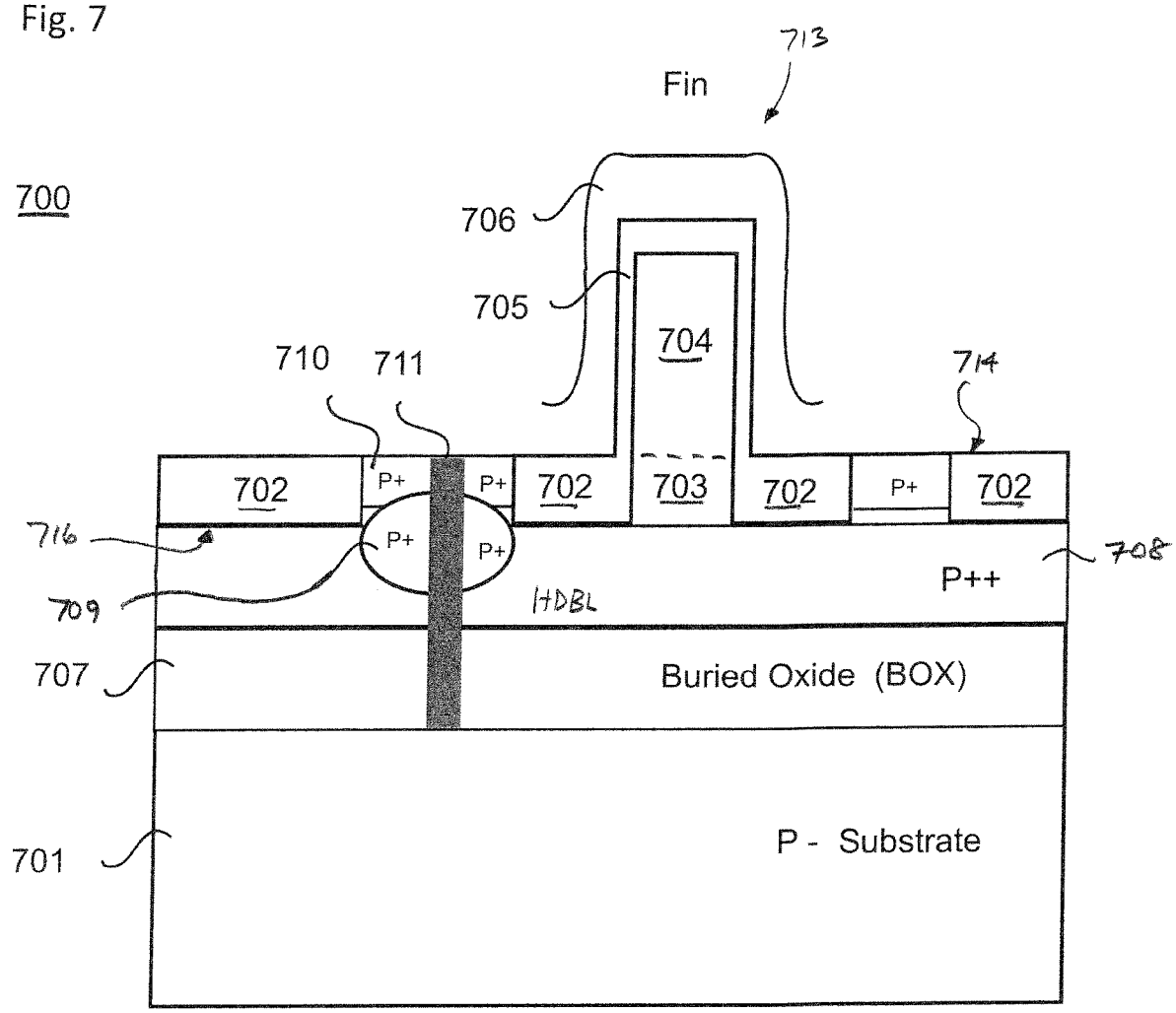
FIG. 7 depicts a FinFET structure in accordance with a fifth embodiment of the disclosure.

FIG. 7 is a cross-sectional drawing depicting a SOI FinFET in accordance with a fifth embodiment of the disclosure. The FinFET 700 is formed on a substrate 701. Isolation structure 702 is formed in the substrate 701. A fin body connecting region 703 is formed between adjacent regions of the isolation structure 702 in the substrate 701. The active part of the transistor device, the fin body 704, extends above the substrate surface 714, and above the isolation structure 702. The fin body 704 is surrounded on three sides by a gate dielectric layer 705. A MOSFET gate electrode 706 is formed on the gate dielectric layer 705 wrapping on three sides the fin body 704. A heavily-doped buried layer 708 is formed in the substrate 701 below the isolation structure 702. A buried oxide layer 707 is formed below the heavily-doped buried layer 708, and whose top surface (i.e., upper boundary) abuts the bottom surface of the heavily-doped buried layer 708. The heavily-doped buried layer 708 top surface abuts the isolation structure 702 and abuts fin connecting region 703. An implanted region 709 extends upward from the heavily-doped buried layer 708. A second implanted region 710 extends from the device surface 714 to the implant 709 to form a low resistance shunt to the heavily-doped buried layer 708. The implanted regions 709 and 710 can be integrated with the p+ substrate contact of the FinFET structure to form a single low resistance path to the substrate. Additionally, a SOI contact 711 structure to the underlying substrate is formed through the buried oxide layer 707. The SOI contact 711 extends from the top of the isolation structure 702 (i.e., surface 714), through the silicon region (e.g. p-well or p− substrate region), through the heavily-doped buried layer 708, and through the buried oxide layer 707. This SOI contact 711 may be filled with polysilicon which is doped to provide a low resistance contact structure. Alternatively, refractory metals can be used for the SOI contact 711. Implanted regions 709 and 710 can be integrated with the SOI contact 711 structure. The advantage of this structure is that it provides a low thermal resistance to the fin in a SOI technology. The low resistance structure allows for thermal transfer from the self-heating formed in the FinFET device. The utilization of the heavily-doped buried layer 708 provides transfer of heat from the FinFET channel region to the contact 710, 711, and at the same time, the buried oxide layer lowers the sensitivity to SEU and SEL. Additionally, due to the high doping concentration of the heavily-doped buried layer, the recombination time of minority carriers generated in the FinFET and under the isolation structure 702 is small due to Auger recombination. In this embodiment, the implantation used to form the heavily-doped buried layer may be masked to form the heavily-doped buried layer only under the p-channel FinFET or only under the n-channel FinFET. In a case where it is placed only under the n-channel FinFET, an n-well may be placed under the p-channel FinFET (not shown). By masking the heavily-doped buried layer under the p-channel FinFET, the n-well is not counter-doped.

Figure 8:
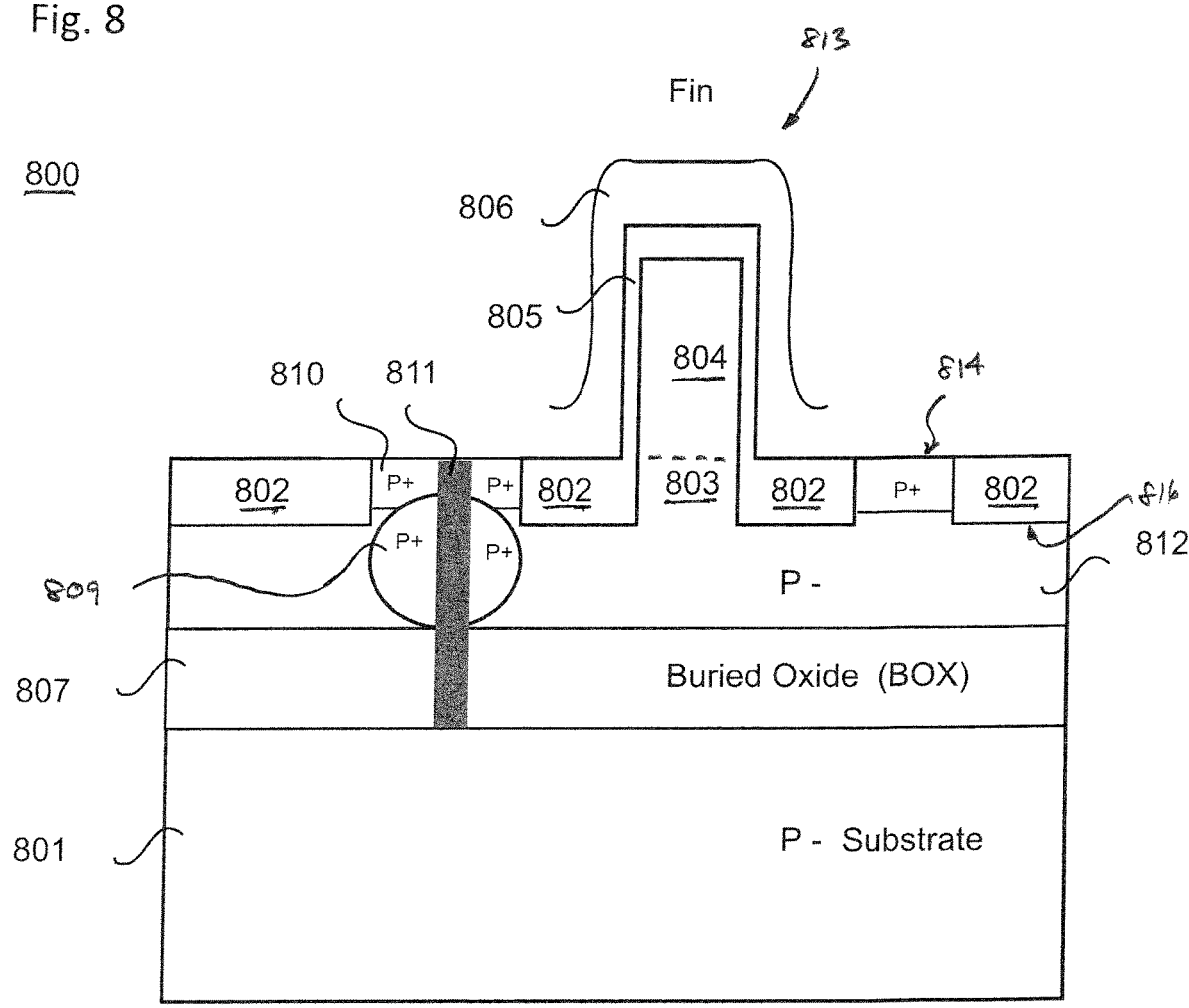
FIG. 8 depicts a SOI FinFET structure in accordance with a sixth embodiment of the disclosure.

FIG. 8 illustrates a SOI FinFET in accordance with a sixth embodiment of the disclosure, which does not incorporate a heavily-doped buried layer. The SOI FinFET 800 is formed on a substrate 801. Isolation structure 802 is formed in the substrate 801 extending to the substrate planar surface 814. A fin connecting region 803 is disposed between adjacent regions of the isolation structure 802 in the substrate 801. The fin connecting region 803 can have a tapering of the isolation sidewall (not shown here) to lower the electrical and thermal resistance of the SOI FinFET structure. The fin body 804 extends above the planar substrate surface 814 and above the isolation structure 802. The fin body 804 is surrounded on three sides by a gate dielectric layer (i.e., gate dielectric film) 805. A MOSFET gate electrode 806 is formed on the gate dielectric layer 805 wrapping on three sides the fin body 804. A buried oxide layer 807 is formed in the substrate 801. The region 812 below the isolation structure 802 can contain a p-well region for an n-channel SOI FinFET. In a dual well SOI CMOS technology, an n-well implant would be formed in this region 812 above the buried oxide layer 807. An implanted region 809 and a second implanted region 810 extends from the device surface to the buried oxide layer 807 preventing minority carrier diffusion, and forming a guard ring structure. The implanted regions 809 and 810 can be integrated with the p+ substrate contact of the FinFET structure to form a single low resistance path into the substrate. Additionally, a SOI contact 811 structure to the underlying substrate is formed through the buried oxide layer 807. The SOI contact 811 penetrates through the isolation structure 802, and through the buried oxide layer 807. This SOI contact 811 may be filled with polysilicon which is doped to provide a low resistance contact. Implanted regions 809 and 810 can be integrated with the SOI contact 811 structure. The SOI contact 811 can also alternatively have refractory metal films (e.g. such as tungsten, titanium, tantalum). The utilization of the buried oxide layer 807 lowers the sensitivity to SEU and SEL.

Figure 9:
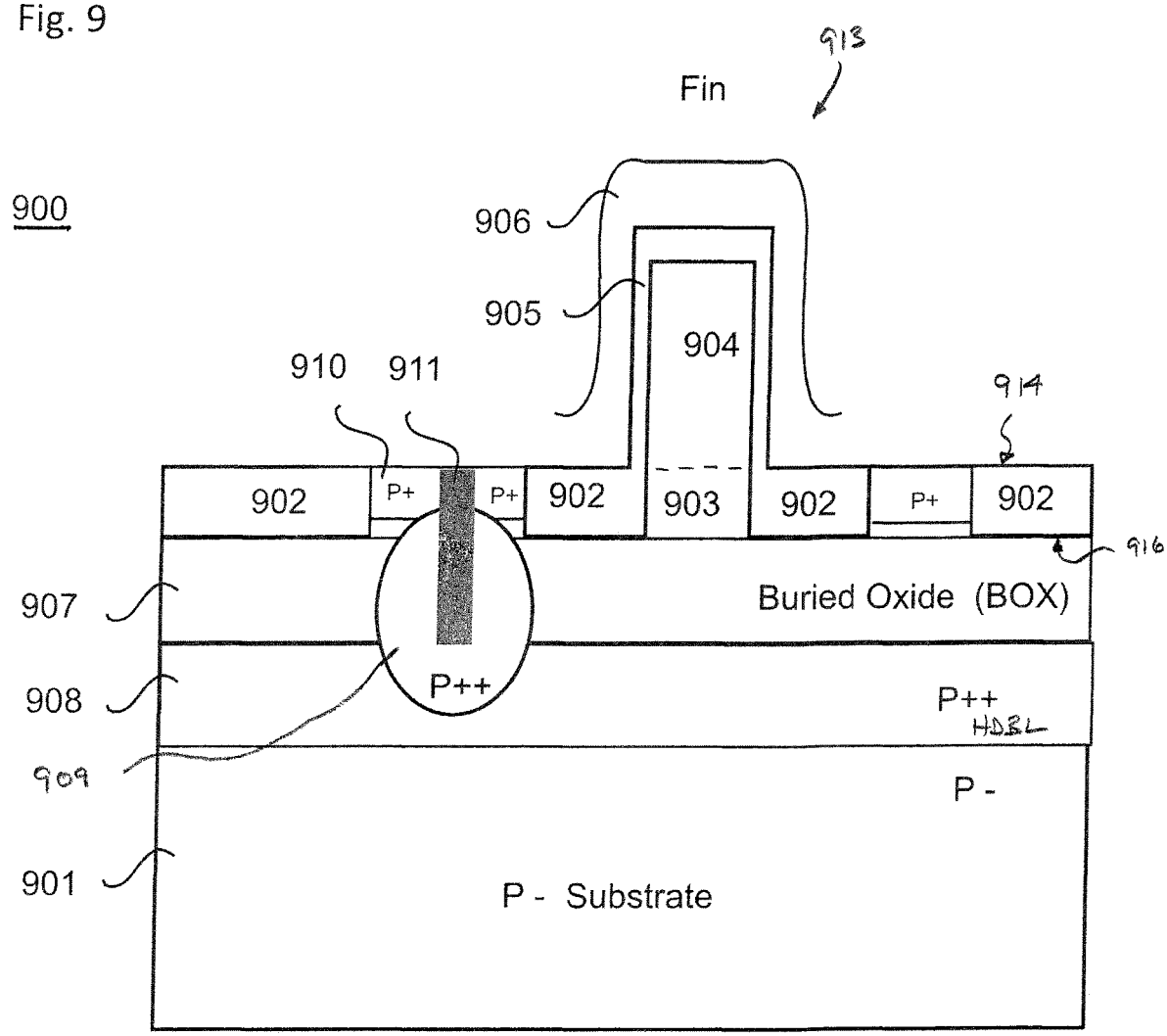
FIG. 9 depicts a SOI FinFET structure in accordance with a seventh embodiment of the disclosure.

FIG. 9 is a cross-sectional drawing depicting a SOI FinFET in accordance with a seventh embodiment of the disclosure. The SOI FinFET 900 is formed on a substrate 901. Isolation structure 902 is formed in the substrate 901 and extends to the substrate planar surface. A fin structure 913 has a fin body 904, and a fin connecting region 903 disposed in the substrate 901 between adjacent regions of the isolation structure 902 disposed on opposite sides of the fin body 904. The fin connecting region 903 extends vertically from the bottom surface 916 of the isolation 902 to the silicon substrate surface 914. The fin body 904 extends above the silicon substrate surface 914 and extends vertically above the isolation structure 902. The fin body 904 is surrounded on three sides by a gate dielectric layer 905. A MOSFET gate electrode 906 is formed on the gate dielectric layer 905 wrapping on three sides the fin body 904. A heavily-doped buried layer 908 is formed in the substrate 901 below a buried oxide layer 907 whose bottom surface abuts the top surface of the heavily-doped buried layer 908. Additionally, a SOI contact 911 structure to the substrate below (e.g., bulk wafer below) is formed through the buried oxide layer 907. The SOI contact 911 penetrates through the isolation structure 902, and through the buried oxide layer 907. This SOI contact 911 is preferably filled with polysilicon which is doped to provide a low resistance contact. The SOI contact 911 can be filled with alternate materials such as refractory metal. An implanted region 909 extends to the heavily-doped buried layer 908. A second implanted region 910 extends from the device surface 914 to the implanted region 909 to form a lower resistance shunt from the heavily-doped buried layer 908 to a surface contact. The implanted regions 909 and 910 can be integrated with the p+ substrate contact of the FinFET structure to form a single low resistance path to the wafer. Implanted regions 909 and 910 can be integrated with the SOI contact 911 structure. The advantage of this structure is that it provides a low thermal resistance to the fin body in an SOI technology. The presence of the low resistance heavily-doped buried layer below the buried oxide layer provides transfer of heat from the FinFET channel region to the contact 911.

Figure 10:
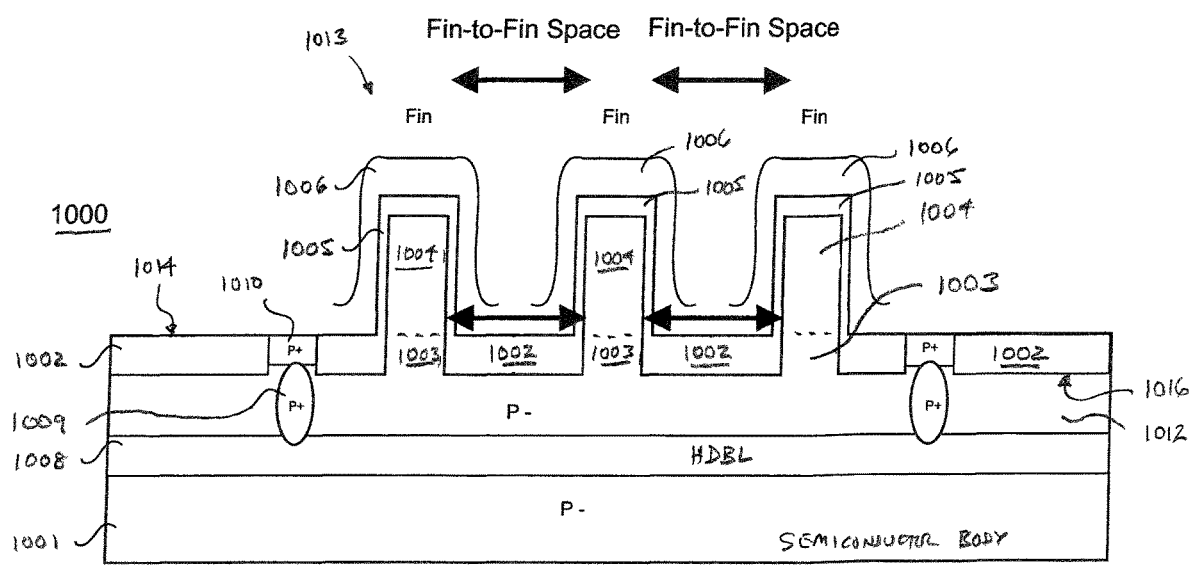
FIG. 10 depicts an exemplary FinFET structure having multiple fins.

FIG. 10 is a structure illustrating a FinFET with a multiple fins. FinFET devices have at least one fin, and can have a plurality of parallel fins within a given device, similar to a "multi-finger MOSFET." Hence, a FinFET 1000 includes a multi-fin structure placed in a common well or common tub region 1012. To illustrate this, FIG. 10 shows a plurality of fins 1013 in a semiconductor body 1001 (e.g., a semiconductor substrate). An isolation region 1002 extends from the substrate surface 1014 into the substrate 1001. A respective fin body connecting region 1003 is formed between the associated isolation regions 1002 disposed on opposite sides of the respective fin body 1004, which extends above the substrate surface 1014. A gate dielectric layer 1005 is formed on each fin body 1004. The gate electrode 1006 is formed on the gate dielectric 1005. A heavily-doped buried layer 1008 is disposed under the array of fin structures 1013. Vertical connecting implants 1009 and 1010 extend from the silicon surface 1014 to the heavily-doped buried layer 1008. To achieve improved circuit density, reducing the required spacing between adjacent fin structures is important. The fin-to-fin spacing is reduced to provide increased density of the active area of the FinFET structure. The limitations of the density is a function of the isolation regions 1002, the tapering of the isolation regions 1002 in the fin connecting region 1003, and gate electrode materials 1006, inter-level dielectrics, contacts, and interconnects.

Figure 11:
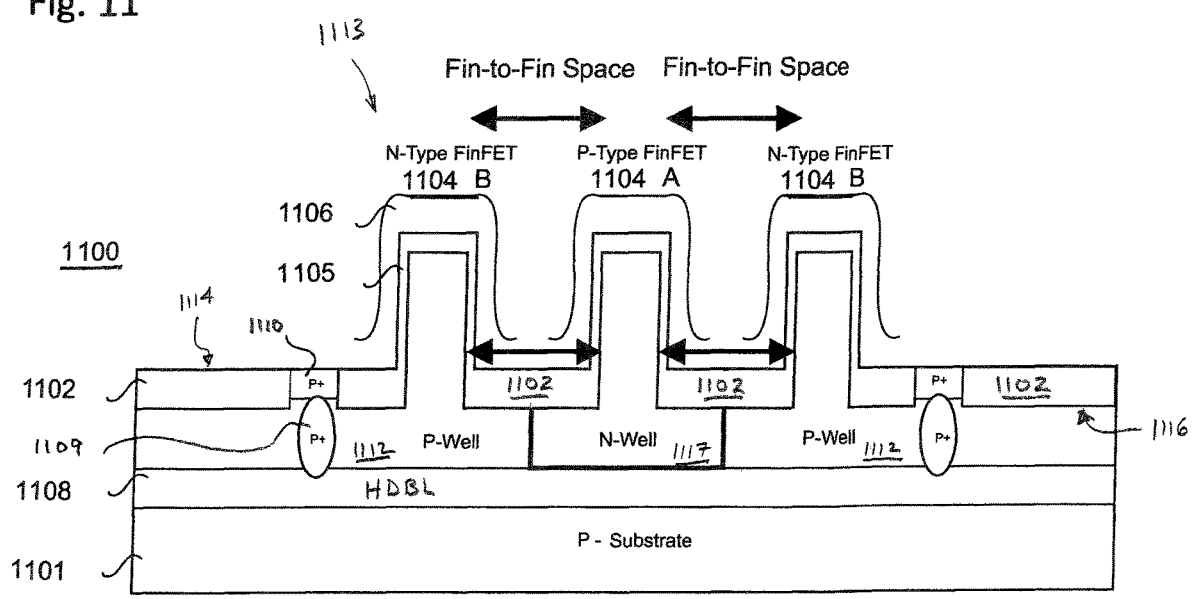
FIG. 11 depicts exemplary N-type and P-type FinFET structures.

FIG. 11 is a cross-sectional drawing illustrating an N-type and P-type FinFET.

Hence, a CMOS circuit can contain both dopant types of FinFETs. FIG. 11 illustrates a P-type and an N-type FinFET disposed in a common wafer 1101. An isolation region 1102 extends from the substrate wafer surface 1114 into the substrate 1101. A fin body connecting region 1103 is formed between the isolation regions 1102. A fin body 11040A and fin body 11040B extends above the substrate surface 1114. Gate dielectric 1105 is formed on the fin body 1104A and fin body 1104B. The gate electrode materials 1106 are formed on the gate dielectric 1105. A heavily-doped buried layer 1108 is placed under the array of fin body structures 1104.

Vertical connecting implant regions 1109 and 1110 extend from the silicon surface 1114 to the buried layer 1108. The p-type FinFET (i.e., fin body 1104A) is disposed in an n-well 1117, whereas the n-type FinFET (i.e., fin body 1104B) is placed in a p-well 1112. To provide circuit density, the adjacency of fin structures is important. The required fin-to-fin spacing is reduced to thereby provide increased density of the active area of the FinFET structure. The limitations of the density is a function of the isolation regions 1102, the tapering of the isolation regions 1102 adjacent to the fin connecting regions 1103, and materials forming the gate electrode 1106, inter-level dielectrics, contacts, and interconnects. CMOS latchup also limits the spacing of the p-type and n-type FinFET. Tapering of the isolation regions 1102 reduces the latchup robustness of the multiple-fin structure. Hence, it is an advantage to utilize the heavily-doped buried layer 1108 to lower the bipolar current gain of the parasitic lateral npn device under the n-type FinFET.

Figure 12:
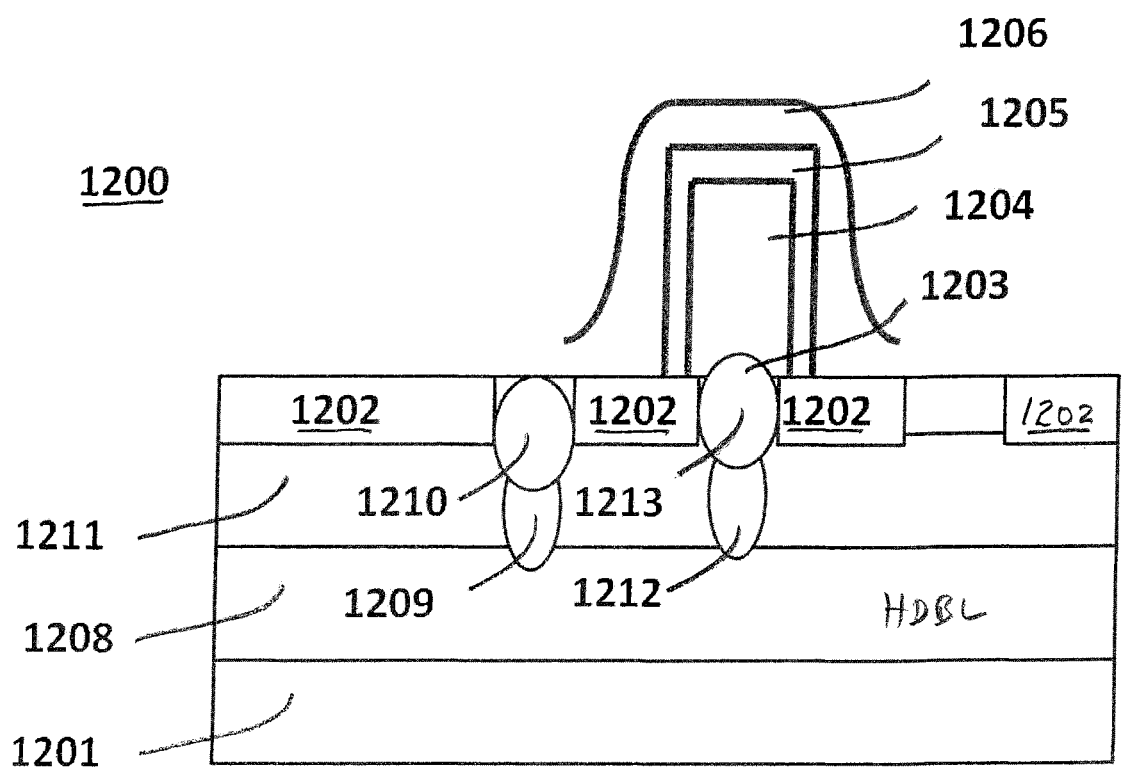
FIG. 12 depicts a FinFET structure in accordance with an eighth embodiment.

FIG. 12 is a cross-sectional drawing depicting a FinFET in accordance with an eighth embodiment. In this embodiment, implants are placed under the fin body. Implants can be placed under the fin body region between the fin body and the buried layer in the fin connecting region to provide a low electrical and thermal resistance. FIG. 12 shows the placement of implants connecting the substrate surface with the heavily-doped buried layer adjacent to the FinFET structure, as well as under the FinFET fin structures. In this embodiment, the electrical and thermal resistance is lowered further by placement of implants below the silicon substrate surface to the heavily-doped buried layer, and in the fin connecting region between the isolation structure. These implants can be the same implants as illustrated in FIG. 3 or additional implantation. The FinFET 1200 is formed on a substrate 1201. Isolation structure 1202 is formed in the substrate 1201 and extends from the substrate planar surface into the substrate wafer. A fin structure has a fin connecting region 1203 between the isolation structure 1202 in the substrate 1201 referred to as the fin body connecting region. The isolation region 1202 can be tapered at an angle on the edges of region 1203. The fin body 1204 extends above the planar silicon substrate surface and above the isolation structure 1202. The fin body 1204 is surrounded by a gate dielectric 1205. A MOSFET gate electrode 1206 is formed on the gate dielectric 1205 wrapping on three sides the fin body 1204. A heavily-doped buried layer 1208 is formed in the substrate 1201 and below the isolation structure 1202. An implant 1209 extends from the buried layer 1208, toward the substrate surface (e.g. top of the isolation structure 1202). A second implant 1210 extends from the substrate surface to the implant 1209 to form a lower resistance shunt to the buried layer. The implant 1209 and 1210 can be integrated with the p+ substrate contact (or p-well tap) of the FinFET structure to form a single low resistance path to the bulk wafer 1201. Region 1211 can include p-well implants abutting the buried layer and vertical implants 1209 and 1210. Region 1211 can include a p-well implant for an n-channel FinFET, or an n-well implant for a p-channel FinFET structure. The n-well and p-well implants can abut in CMOS FinFET technology at the edges under the isolation structure 1202. The well implants placed in region 1211 can abut the trench isolation on the top surface, and can abut the heavily-doped buried layer on the lower surface. In this embodiment, additional implanted regions 1212, 1213 are disposed in the fin connecting region 1203 to lower the electrical resistance under the fin body 1204. Implanted region 1213 is disposed in the fin connecting region 1303, and overlaps into the fin body 1204. Implanted region 1212 overlaps the implanted region 1213 and extends downward to the heavily-doped buried layer 1208. Implanted regions 1212, 1213 together form a fin body-to-buried layer implanted region to provide a low resistance between the fin body 1204 and the heavily-doped buried layer 1208. Hence, one advantage of this embodiment is there is a continuous low resistance path formed by the fin body-to-buried layer implant, the buried layer implant, and the buried layer connecting implants. The doping concentration in the fin connecting region 1203 beneath the fin body 1204 (i.e., beneath the transistor channel) may be optimized separately relative to the doping concentration of the p-well in other areas, and thus provides a considerable degree of design freedom. Additionally, the implants provide a shield from minority carrier collection with the combination of the heavily-doped buried layer, and the fin body-to-buried layer connecting implants. In the structure, the implanted regions 1212, 1213 under the fin body may be formed together with the vertical implanted regions 1209 and 1210, using the same energy and dose, and sharing the dopant implantation steps. The implanted regions 1212, 1213 under the fin body may also use different implantation steps having different doses and energies to provide a continuous low resistance conductive path. The FinFET device heavily-doped buried layer 1208 doping concentration may be in the range $10^{19}/cm^3$ to $10^{21}/cm^3$. The implanted region 1213 may have a doping concentration in the range $10^{18}/cm^3$ to $10^{21}/cm^3$. The implanted region 1212 in the fin connecting region may have a doping concentration in the range $10^{19}/cm^3$ to $10^{21}/cm^3$.

Figure 13C:
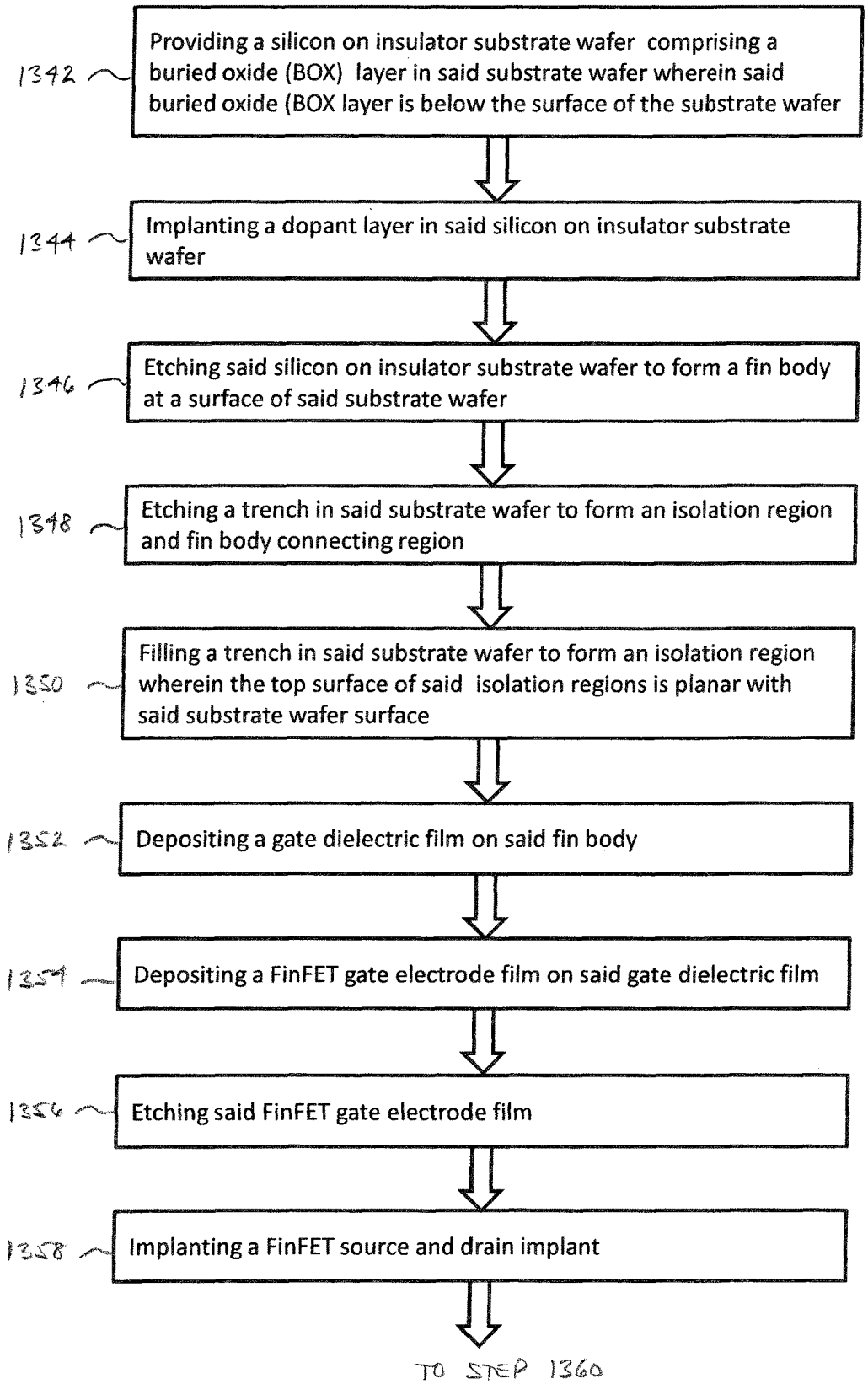
FIG. 13A depicts a SOI FinFET structure in accordance with ninth embodiment.
FIG. 13B (comprising FIGS. 13C, 13D, and 13E) illustrates an example method of forming the SOI FinFET structure depicted in FIG. 13A.
Figure 13D:
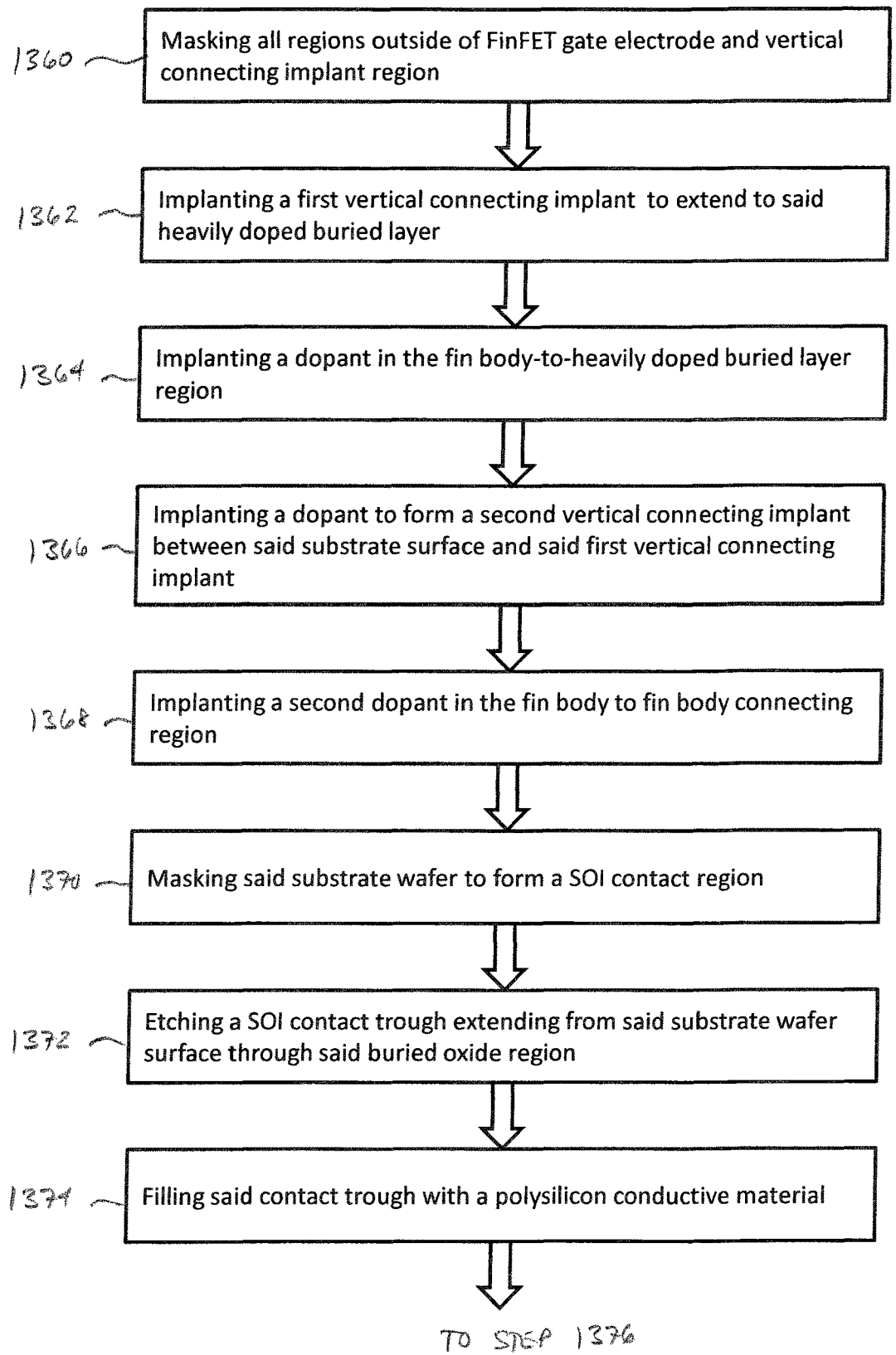

FIG. 13A illustrates a SOI FinFET structure in accordance with a ninth embodiment. In this embodiment, the electrical and thermal resistance is lowered further by placement of implants below the silicon substrate surface to the heavily-doped buried layer, under the fin body, and in the fin connecting region between the adjoining isolation structure regions. The SOI FinFET 1300 is formed on a substrate 1301. Isolation structure 1302 is formed in the substrate 1301 extending to the substrate planar surface. A fin connecting region 1303 is formed between the isolation structure 1302 regions in the substrate 1301. The fin connecting region 1303 can have a tapering of the isolation sidewall to lower the electrical and thermal resistance of the SOI FinFET structure. The fin body 1304 extends above the planar substrate surface and above the isolation structure 1302. The fin body 1304 is surrounded by a gate dielectric 1305. A MOSFET gate electrode 1306 is formed on the gate dielectric 1305 wrapping on three sides the fin body 1304. A buried oxide (BOX) layer 1307 is formed in the substrate wafer. A region 1312 can contain a p-well region for an n-channel SOI FinFET. In a dual well SOI CMOS technology, an n-well implant would be formed in this region above the buried layer (BOX) layer 1307. An implant 1309 and a second implant 1310 extends from the device surface to the buried oxide (BOX) layer 1307 preventing minority carrier diffusion forming a guard ring structure. The implant 1309 and 1310 can be integrated with the p+ substrate contact of the FinFET structure to form a single low resistance path to the wafer. Additionally, a SOI contact 1311 structure to the bulk wafer below is formed through the buried oxide (BOX) layer 1307. The SOI contact 1311 penetrates through the isolation structure 1302, and through the buried oxide (BOX) layer 1307. This SOI contact 1311 is filled with polysilicon which is doped to provide a low resistance contact. Implanted regions 1309 and 1310 can be integrated with the SOI contact 1311 structure. The SOI contact 1311 can also alternatively have refractory metal films (e.g. such as tungsten, titanium, tantalum). In this embodiment, additional implanted regions 1313 and 1314 are disposed in the fin connecting region 1303 to lower the electrical resistance under the fin body 1304. Implanted region 1314 is disposed in the fin connecting region 1303, and overlaps into the fin body 1304. Implanted region 1313 overlaps the implanted region 1314 and extends downward to the heavily-doped buried layer 1308. Implanted regions 1313, 1314 together form a vertical implanted region to provide a low resistance between the fin body 1304 and the heavily-doped buried layer 1308. The implanted regions 1313 and 1314 under the fin body 1304 may be formed together with the implanted regions 1309 and 1310 (as described above regarding FIG. 12); but alternatively the implanted regions 1313 and 1314 may be formed using independent implantation steps to optimize the dose and energy to provide the optimum low resistance path and continuity between the fin body 1304 and the heavily-doped buried layer 1308. The FinFET device heavily-doped buried layer 1308 doping concentration may be in the range $10^{19}/cm^3$ to $10^{21}/cm^3$. The implanted region 1314 may have a doping concentration in the range $10^{18}/cm^3$ to $10^{21}/cm^3$. The implanted region 1313 in the fin connecting region may have a doping concentration in the range $10^{19}/cm^3$ to $10^{21}/cm^3$.

FIG. 13B illustrates an example method 1340 of forming the SOI FinFET structure depicted in FIG. 13A. At step 1342, a silicon-on-insulator substrate wafer is provided that includes a buried oxide layer below the surface of the substrate wafer. There are several known techniques for making such a silicon-on-insulator wafer, including a SOITec process, a SIMOX process, and bonding-and-etch back so that the process flow starts with a substrate wafer already having the buried oxide layer. Alternatively, such a buried oxide layer may be formed by ion implantation. At step 1344, an implantation step is performed to form the heavily-doped buried layer (i.e., dopant layer). This implantation may be performed at a later point in the process flow, but doing so early in the flow provides for a planar buried layer and does not negatively affect gate dielectric formation. Exemplary implantation parameters are described in regards to FIG. 3 above.

Many of the enumerated steps are clear without further explanation or comment, but several comments may nonetheless be helpful. The implantation step 1362 forms the implanted region 1309, and the implantation step 1364 forms the implanted region 1313 in the fin connecting region 1303 beneath the fin body 1304. These implantations may be performed individually using separate implant energies and doses, or may be combined into a single implantation step using a common implant energy and dose, since both implanted regions are disposed at a similar depth and may have the same doping concentration. Similarly, the implantation step 1366 forms the implanted region 1310, and the implantation step 1368 forms the implanted region 1314 in the fin connecting region 1303 and overlapping the fin body 1304. These implantations may also be performed individually or may be combined into a single implantation step. Exemplary implantation parameters are described in regards to FIG. 3 above.

FIG. 14 illustrates a method of forming a FinFET in accordance with the first embodiment of the disclosure. The method 1400 of forming a FinFET includes a first step 1410 of providing a semiconductor body having a first conductivity type. A semiconductor body may be viewed as being a surface portion of an underlying substrate, such as a semiconductor wafer, a semiconductor wafer bonded to another substrate, an epitaxial layer grown on an underlying substrate, and a number of other structures having a semiconductor surface region. At step 1420 a fin body is formed on an upper surface of the semiconductor body. At step 1430, an isolation structure is formed in the semiconductor body below the upper surface. The isolation structure includes respective first and second regions disposed on opposite sides of the fin body, which define a fin connecting region disposed in the semiconductor body below the fin body and between the first and second isolation regions. At step 1440, a gate dielectric layer is formed on three sides of the fin body. At step 1450, a gate electrode is formed on the gate dielectric layer. Step 1460 includes forming a heavily-doped buried layer of the first conductivity type in the semiconductor body, extending laterally beneath the fin connecting region and beneath the first and second isolation regions, and having a higher doping density than the semiconductor body. In some embodiments, step 1460 may be performed much earlier in the flow (e.g., after step 1420 and before step 1430). At step 1470, a vertical conductive region is formed in the semiconductor body between a surface contact and the heavily-doped buried layer. This vertical conductive region provides a lower resistance than otherwise would be provided by the semiconductor body in the absence of the vertical conductive region.

In certain embodiments the heavily-doped buried layer is vertically spatially separated from said isolation regions. In certain embodiments, the heavily-doped buried layer vertically abuts the isolation regions.

In certain embodiments, the method may also include forming a buried oxide layer in the semiconductor body, and forming an SOI substrate contact. In certain embodiments the SOI substrate contact is integrated with the vertical conductive region.

Figure 15:
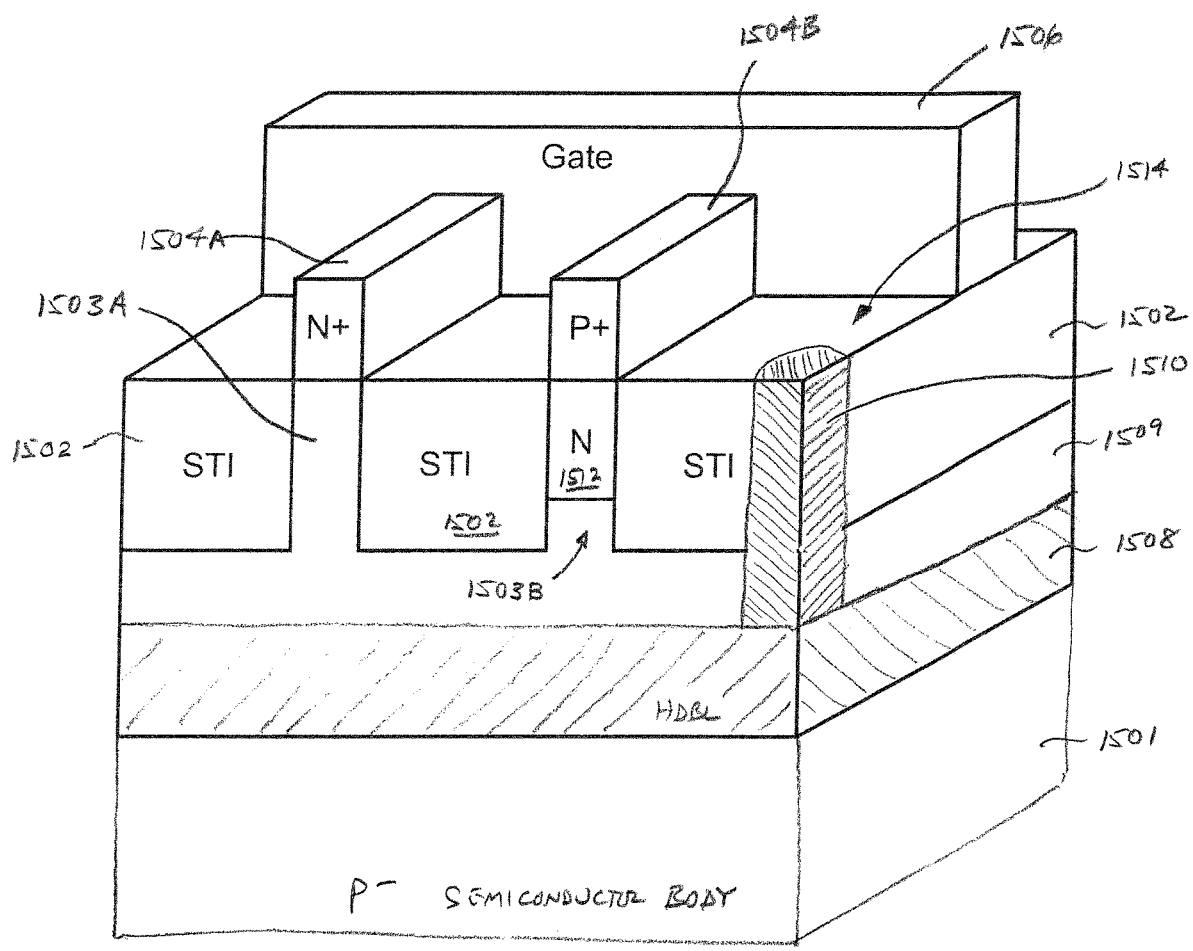
FIG. 15 is a three-dimensional view of a FinFET structure in accordance with another embodiment of the disclosure.

FIG. 15 is a three-dimensional view illustrating an N-type and P-type FinFET formed on a lightly-doped p-type semiconductor body 1501. The N-type FinFET includes a fin body 1504A disposed on and extending above the upper surface 1514 of the semiconductor body 1501, and the P-type FinFET includes a fin body 1504B disposed on and extending above the upper surface 1514 of the semiconductor body 1501. An isolation structure 1502 is formed at the upper surface 1514, and extends from the semiconductor body upper surface 1514 into the semiconductor body 1501. The isolation structure 1502 includes a respective pair of isolation regions 1502 disposed on opposite sides of each respective fin body 1504A and 1504B. A respective fin connecting region 1503A, 1503B is disposed below each respective fin body 1504A, 1504B, and between the associated isolation regions 1502. The fin connecting region 1503A for the N-type FinFET is disposed in a p-well region 1509, and the fin connecting region 1503B for the P-type FinFET is disposed in an n-well region 1512. A gate dielectric layer (not shown) is disposed on three sides of each fin body 1504A, 1504B, and a gate electrode 1506 is disposed on the gate dielectric layer and wraps around three sides of each fin body 1504A, 1504B. A heavily-doped buried layer 1508 is disposed under both fin body structures 1504A, 1504B and under the p-well region 1509. A vertical conductive region 1510 extends from the semiconductor body surface 1514 to the heavily-doped buried layer 1508. This vertical conductive region 1510 provides a lower resistance shunt to the heavily-doped buried layer 1508 than would otherwise be provided in the absence of the vertical conductive region 1510 (i.e., by the well region 1509 and an associated well contact). As described above in regards to certain other embodiments, this vertical conductive region 1510 may be implemented using multiple overlapping implanted regions of different depths, and may be integrated with a SOI contact structure in embodiments using a buried oxide layer (not shown here). The vertical conductive region 1510 may also be implemented using a conductive pillar, such as polysilicon, a refractory metal, a true metal, and the like.

The FinFET devices and techniques described in the present application can improve radiation immunity, by directly addressing one or more of the primary degradation radiation effects of ICs: Total Ionizing Dose (TID), Single Event Latch-up (SEL), and Single-Event Upset (SEU). In addition, other benefits and advantages are provided by one or more of the embodiments. For example, the tapering angle of the isolation regions adjacent to the fin connecting region below the fin body can be reduced (i.e., less tapered) due the presence of the heavily-doped buried layer, the vertical contact to the heavily-doped buried layer, and/or the BOX layer. In some cases the tapering angle of the isolation regions can be zero, which provides smaller fin-to-fin spacing and consequently better circuit density. A tradeoff can also be made between the tapering angle and the doping concentration in the fin connecting region below the fin body.

Certain embodiments described herein show an overlapping pair of implanted regions, one located vertically above the other, to form a conductive path to a lower structure, such as an underlying heavily-doped buried layer. Such overlapping pair of implanted regions may be viewed as a vertical conductive region. Also, certain embodiments may describe a heavily-doped buried layer and a doped buried layer. No distinction is intended between these terms, unless the context so requires.

Certain example embodiments presented herein describe a FinFET structure formed on a substrate or substrate wafer. In a broader sense, any of the disclosed embodiments may be formed on a semiconductor body and not just on a literal substrate such as a silicon wafer. A semiconductor body may be viewed as being a surface portion of an underlying substrate, which might be a ceramic, a semiconductor wafer, a semiconductor wafer bonded to another substrate, an epitaxial layer grown on an underlying substrate, a SON structure, or any number of other structures having a semiconductor surface region.

As used herein, a doping concentration (also known as a doping density) may be described as a number of dopant atoms per cubic centimeter, such as $10^{19}/cm^3$. Such a concentration may equally well be written as $10^{19}$ $cm^{-3}$. As used herein, reference to a film (e.g., gate dielectric film) may be used interchangeably with a layer (e.g., gate dielectric layer). As used herein, a reference to a top surface or upper surface of a region (e.g., top surface of a well region) may be used interchangeably with an upper boundary of the region (e.g., upper boundary of a well region). When referencing a structural drawing herein, a colloquial reference to an "implant" (e.g., implant 509) may be used interchangeably with a more precise reference to an "implant region" or "implanted region" (e.g., implanted region 509). As used herein, the term "exemplary" may be used merely to describe an example, and not to imply any superior or preferred aspect over other examples.

These approaches can further take advantage of a variety of different IC fabrication technologies, such as silicon-on-sapphire (SOS), silicon on nothing (SON) and the like. Additionally, although the examples of the present application focus on MOS (and particularly CMOS) implementations, it will be understood by those having ordinary skill in the art that the devices and techniques disclosed herein can be extended to other semiconductor architectures such as LDMOS, DeMOS, and BiCMOS, etc.

It will be appreciated by those skilled in the art having the benefit of this disclosure that FinFET devices with improved reliability are described, for both CMOS and SOI FinFET structures. The disclosed embodiments may provide reduced self-heating of a FinFET structure, reduced sensitivity to latchup and other transient events, reduced taper of isolation regions on opposite sides of a fin body, and/or reduced lateral spacing between individual fins of a FinFET structure. In certain embodiments, such improvements may be accomplished by utilizing, alone or in combination, a heavily-doped buried layer coupled to a surface contact by a vertical conductive region, a buried oxide layer, an SOI contact structure, and an implanted region in the fin connecting region.

It should be understood that the drawings and detailed description herein are to be regarded in an illustrative rather than a restrictive manner, and are not intended to be limiting to the particular forms and examples disclosed. On the contrary, included are any further modifications, changes, rearrangements, substitutions, alternatives, design choices, and embodiments apparent to those of ordinary skill in the art, without departing from the spirit and scope hereof, as defined by the following claims. Thus, it is intended that the following claims be interpreted to embrace all such further modifications, changes, rearrangements, substitutions, alternatives, design choices, and embodiments.

What is claimed is:

1. A method of forming a FinFET device, said method comprising:
    providing a semiconductor body having a first conductivity type;
    forming a fin body on an upper surface of the semiconductor body;
    forming an isolation structure in the semiconductor body below the upper surface and having respective first and second regions disposed on opposite sides of the fin body, defining a fin connecting region disposed in the semiconductor body below the fin body and between the first and second isolation regions;
    forming a gate dielectric layer on three sides of the fin body;
    forming a gate electrode on the gate dielectric layer; and
    forming a heavily-doped buried layer of the first conductivity type in the semiconductor body, extending laterally beneath the fin connecting region and beneath the first and second isolation regions, and having a higher doping density than the semiconductor body.

2. The method as in claim 1, further comprising:
    forming a vertical conductive region in the semiconductor body between a surface contact and the heavily-doped buried layer, and providing a lower resistance than otherwise would be provided by the semiconductor body in the absence of the vertical conductive region.

3. The method as in claim 2, wherein:
    a bottom surface of the fin body is vertically aligned with an upper surface of the isolation structure.

4. The method as in claim 2 wherein forming the vertical conductive region comprises:
    forming a heavily-doped semiconductor region having a higher doping density than the semiconductor body.

5. The method as in claim 4 wherein forming the heavily-doped semiconductor region comprises:
    forming a first implanted region of the first conductivity type extending from the surface contact into the semiconductor body; and forming a second implanted region of the first conductivity type at least partially overlapping the first implanted region and extending to the heavily-doped buried layer.

6. The method as in claim 5 wherein:
the surface contact comprises an implanted region at the semiconductor body upper surface.

7. The method as in claim 2, wherein:
the heavily-doped buried layer vertically abuts a bottom surface of the isolation structure.

8. The method as in claim 2, wherein:
the heavily-doped buried layer has a doping density in the range of $10^{19}$ cm$^{-3}$ to $10^{21}$ cm$^{-3}$.

9. The method as in claim 2 further comprising:
forming a buried oxide (BOX) layer in the semiconductor body below the isolation structure; and
forming a substrate contact pillar extending from the semiconductor surface, through the BOX layer, and to the semiconductor body below the BOX layer.

10. The method as in claim 9, wherein:
the heavily-doped buried layer is disposed between the isolation structure and the BOX layer.

11. The method as in claim 10, wherein:
the heavily-doped buried layer vertically abuts an upper surface of the BOX layer therebelow.

12. The method as in claim 11, wherein:
the heavily-doped buried layer vertically abuts a bottom surface of the isolation structure thereabove.

13. The method as in claim 10, wherein:
the substrate contact pillar is laterally disposed within the vertical conductive region to thereby form an integrated vertical contact structure.

14. The method as in claim 9, wherein:
the heavily-doped buried layer is disposed below the BOX layer.

15. The method as in claim 14, wherein:
the substrate contact pillar is laterally disposed within the vertical conductive region to thereby form an integrated vertical contact structure.

16. The method as in claim 14, wherein:
the heavily-doped buried layer vertically abuts a lower surface of the BOX layer thereabove.

17. The method as in claim 16, wherein:
the BOX layer vertically abuts a bottom surface of the isolation structure thereabove.

18. The method as in claim 2, further comprising:
forming a third implanted region of the first conductivity type extending from the fin body downward into the fin connecting region.

19. The method as in claim 18, wherein:
the third implanted region extends downward through the fin connecting region and to the heavily-doped buried layer.

20. The method as in claim 18, wherein:
the third implanted region has a doping density in the range of $10^{18}$ cm$^{-3}$ to $10^{21}$ cm$^{-3}$.

21. The method as in claim 18, wherein:
the third implanted region comprises two separate, partially-overlapping implanted regions, one largely disposed in the fin connecting region but extending upward into the fin body, and the other largely disposed below the fin connecting region and extending downward to the heavily-doped buried layer.

22. The method as in claim 21, wherein:
said one implanted region largely disposed in the fin connecting region has a doping density in the range of $10^{18}$ cm$^{-3}$ to $10^{21}$ cm$^{-3}$; and said other implanted region has a doping density in the range of $10^{19}$ cm$^{-3}$ to $10^{21}$ cm$^{-3}$.

23. The method as in claim 2, wherein:
the respective first and second isolation structure regions each have a substantially vertical sidewall adjoining the fin connecting region.

24. The method as in claim 2, wherein:
the respective first and second isolation structure regions each have a substantially tapered sidewall adjoining the fin connecting region.

25. The method as in claim 2, further comprising:
forming a well region disposed in a surface portion of the semiconductor body below the fin body.

26. The method as in claim 25, wherein:
the well region extends beneath the isolation structure.

27. The method as in claim 2, wherein:
the semiconductor body comprises a semiconductor substrate.

28. The method as in claim 2, wherein:
the semiconductor body comprises a silicon-on-insulator (SOI) substrate.

29. The method as in claim 2, further comprising:
forming a second fin body disposed on the upper surface of the semiconductor body;
forming third and fourth isolation regions disposed in the semiconductor body below the upper surface and on opposite sides of the second fin body;
forming a second fin connecting region disposed in the semiconductor body below the second fin body and between the third and fourth isolation regions;
forming a gate dielectric layer disposed on three sides of the second fin body; and
forming a gate electrode disposed on the gate dielectric layer;
wherein the heavily-doped buried layer extends laterally beneath the second fin connecting region and beneath the third and fourth isolation regions.

30. The method as in claim 29, wherein:
the second and third isolation regions together comprise a single isolation region.

31. The method as in claim 29, further comprising:
forming a first well region of the first conductivity type in a surface portion of the semiconductor body below the first-mentioned fin body; and
forming a second well region having a second conductivity type opposite the first conductivity type, said second well region disposed in a surface portion of the semiconductor body below the second fin body.

32. A method of forming a FinFET device, said method comprising:
providing a semiconductor body having a first conductivity type and having an upper surface;
forming a fin body on the upper surface of the semiconductor body;
forming an isolation structure disposed in the semiconductor body below the upper surface and having respective first and second regions disposed on opposite sides of the fin body, defining a fin connecting region disposed in the semiconductor body below the fin body and between the first and second isolation regions;
forming a gate dielectric layer on three sides of the fin body;
forming a gate electrode on the gate dielectric layer;
forming a heavily-doped buried layer of the first conductivity type in the semiconductor body, extending laterally beneath the fin connecting region and beneath the first and second isolation regions, and having a higher doping density than the semiconductor body;

forming a vertical conductive region in the semiconductor body between a surface contact and the heavily-doped buried layer, and providing a lower resistance than otherwise would be provided by the semiconductor body in the absence of the vertical conductive region;

forming a buried oxide (BOX) layer in the semiconductor body and extending laterally beneath the fin connecting region and beneath the first and second isolation regions; and forming a substrate contact pillar extending from the semiconductor surface, through the BOX layer, and to the semiconductor body below the BOX layer, said substrate contact pillar being laterally disposed within the vertical conductive region to thereby form an integrated vertical contact structure.

33. The method as in claim 32, wherein:

the heavily-doped buried layer is disposed below the BOX layer.

34. The method as in claim 33, wherein:

the heavily-doped buried layer vertically abuts a lower surface of the BOX layer thereabove.

35. A method for forming a FinFET device, said method comprising:

providing a semiconductor body having a first conductivity type and having an upper surface;

forming a fin body on the upper surface of the semiconductor body;

forming an isolation structure in the semiconductor body below the upper surface and having respective first and second regions on opposite sides of the fin body, defining a fin connecting region in the semiconductor body below the fin body and between the first and second isolation regions;

forming a gate dielectric layer on three sides of the fin body;

forming a gate electrode on the gate dielectric layer;

forming a buried oxide (BOX) layer in the semiconductor body and extending laterally beneath the fin connecting region and beneath the first and second isolation regions;

forming a vertical conductive region in the semiconductor body between a surface contact and the BOX layer, and providing a lower resistance than otherwise would be provided by the semiconductor body in the absence of the vertical conductive region; and forming a substrate contact pillar extending from the semiconductor surface, through the BOX layer, and to the semiconductor body below the BOX layer, said substrate contact pillar being laterally disposed within the vertical conductive region to thereby form an integrated vertical contact structure.

36. The method as in claim 35, wherein:

the semiconductor body comprises a semiconductor substrate.

37. The method as in claim 35, wherein:

the BOX layer vertically abuts a bottom surface of the isolation structure thereabove.

* * * * *